(12) United States Patent
Harris, IV

(10) Patent No.: US 7,342,762 B2
(45) Date of Patent: Mar. 11, 2008

(54) RESETTABLE CIRCUIT PROTECTION APPARATUS

(75) Inventor: Edwin J. Harris, IV, Oak Park, IL (US)

(73) Assignee: Littelfuse, Inc., Des Plaines, IL (US)

( * ) Notice: Subject to any disclaimer, the term of this patent is extended or adjusted under 35 U.S.C. 154(b) by 224 days.

(21) Appl. No.: 11/271,065

(22) Filed: Nov. 10, 2005

(65) Prior Publication Data

US 2007/0103833 A1    May 10, 2007

(51) Int. Cl.
    *H02H 5/04* (2006.01)
(52) U.S. Cl. ........................... 361/103; 361/160
(58) Field of Classification Search .................. 361/103
    See application file for complete search history.

(56) References Cited

U.S. PATENT DOCUMENTS

| 2,571,027 A | 10/1951 | Garner |
| 2,928,956 A | 3/1960 | Jones |
| 3,519,886 A | 7/1970 | Spencer, III et al. |
| 3,539,870 A | 11/1970 | Schneider et al. |
| 3,539,871 A | 11/1970 | Schneider et al. |
| 3,588,605 A | 6/1971 | Casson |
| 3,629,659 A | 12/1971 | Schneider |
| 3,809,959 A | 5/1974 | Pucher |
| 3,868,549 A | 2/1975 | Schaefer er al. |
| 4,023,264 A | 5/1977 | Schmidt, Jr. et al. |
| 4,164,772 A | 8/1979 | Hingorani |
| 4,233,673 A | 11/1980 | Cricchi et al. |
| 4,306,270 A | 12/1981 | Miller et al. |
| 4,389,691 A | 6/1983 | Hancock |
| 4,420,784 A | 12/1983 | Chen et al. |
| 4,423,457 A | 12/1983 | Brajder |
| 4,438,472 A | 3/1984 | Woodworth |
| 4,475,139 A | 10/1984 | Chadwick |
| 4,531,083 A | 7/1985 | Hoffman |
| 4,531,084 A | 7/1985 | Hoffman |
| 4,546,455 A | 10/1985 | Iwahashi et al. |
| 4,550,356 A | 10/1985 | Takahashi |
| 4,583,146 A | 4/1986 | Howell |
| 4,631,621 A | 12/1986 | Howell |
| 4,636,907 A | 1/1987 | Howell |
| 4,647,340 A | 3/1987 | Szluk et al. |
| 4,652,962 A | 3/1987 | Howell |
| 4,719,531 A | 1/1988 | Okado et al. |
| 4,721,869 A | 1/1988 | Okado |

(Continued)

FOREIGN PATENT DOCUMENTS

JP    2000-090808    3/2000

*Primary Examiner*—Robert L. Deberadinis
*Assistant Examiner*—Luis E. Román
(74) *Attorney, Agent, or Firm*—Bell, Boyd & Lloyd LLP

(57) ABSTRACT

A circuit protection device includes a solid-state resettable switch, a first terminal in electrical communication with a first portion of the switch, the first terminal configured to be connected to a load. A second terminal is placed in electrical communication with a second portion of the switch, the second terminal configured to be connected to a power source. A controller is configured to enable the switch to be opened if an accumulated energy meets or exceeds a preset $I^2t$ rating, the accumulated energy based on a current sensed from an electrical point between one of (i) the load and the switch or (ii) the voltage source and the switch.

25 Claims, 10 Drawing Sheets

U.S. PATENT DOCUMENTS

| | | |
|---|---|---|
| 4,723,187 A | 2/1988 | Howell |
| 4,920,448 A | 4/1990 | Bonhomme |
| 4,959,746 A | 9/1990 | Hongel |
| RE34,107 E | 10/1992 | Wirth |
| 5,164,872 A | 11/1992 | Howell |
| 5,239,511 A | 8/1993 | Oh |
| 5,339,210 A | 8/1994 | Howell |
| 5,360,988 A | 11/1994 | Uda et al. |
| 5,374,792 A | 12/1994 | Ghezzo et al. |
| 5,430,401 A | 7/1995 | Shtulman |
| 5,454,904 A | 10/1995 | Ghezzo et al. |
| 5,519,658 A | 5/1996 | Uda et al. |
| 5,536,980 A | 7/1996 | Kawate et al. |
| 5,596,535 A | 1/1997 | Mushya et al. |
| 5,642,317 A | 6/1997 | Furutani |
| 5,703,463 A | 12/1997 | Smith |
| 5,724,366 A | 3/1998 | Furutani |
| 5,793,586 A | 8/1998 | Rockot et al. |
| 5,894,397 A * | 4/1999 | Nelson ....................... 361/160 |
| 5,933,304 A | 8/1999 | Irissou |
| 5,933,308 A | 8/1999 | Garzon |
| 5,942,714 A | 8/1999 | Oberlin et al. |
| 6,078,092 A | 6/2000 | Wang |
| 6,096,580 A | 8/2000 | Iyer et al. |
| 6,141,192 A | 10/2000 | Garzon |
| 6,218,844 B1 | 4/2001 | Wong et al. |
| 6,288,881 B1 | 9/2001 | Melvin et al. |
| 6,313,641 B1 | 11/2001 | Brooks |
| 6,377,427 B1 | 4/2002 | Haun et al. |
| 6,411,482 B1 | 6/2002 | Funke |
| 6,469,884 B1 | 10/2002 | Carpenter, Jr. et al. |
| 6,477,021 B1 | 11/2002 | Haun et al. |
| 6,498,385 B1 | 12/2002 | Daubenspeck et al. |
| 6,531,410 B2 | 3/2003 | Bertin et al. |
| 6,532,424 B1 | 3/2003 | Haun et al. |
| 6,587,027 B1 | 7/2003 | Nadd |
| 6,621,669 B1 | 9/2003 | Haun et al. |
| 6,625,550 B1 | 9/2003 | Scott et al. |
| 6,674,667 B2 | 1/2004 | Forbes |
| 6,710,640 B2 | 3/2004 | Kothandaraman et al. |
| 6,746,947 B2 | 6/2004 | Daubenspeck et al. |
| 6,781,436 B2 | 8/2004 | Kothandaraman et al. |
| 6,782,329 B2 | 8/2004 | Scott |
| 6,813,129 B2 | 11/2004 | Burdick |
| 6,870,720 B2 | 3/2005 | Iwata et al. |
| 6,956,772 B2 | 10/2005 | Forbes |
| 2006/0023383 A1 * | 2/2006 | Thiery et al. ............... 361/100 |

* cited by examiner

RESETTABLE CIRCUIT PROTECTION APPARATUS

BACKGROUND

The present invention relates to circuit protection and more particularly to resettable circuit protection.

Automotive fuses, such as blade type fuses are known in the art. Modern electrical blade fuses have been manufactured by Littelfuse, Inc., the assignee of the present invention. Blade fuses protect electrical automotive circuits from current overloads. The protection results from an opening of a fuse element located within the fuse, which stops the flow of current to the circuit protected by the fuse. Upon a current overload of a certain magnitude and over a predetermined length of time the fuse element or link breaks or opens.

Automobile manufacturers are constantly adding more electrical devices and accessories to automobiles. Consequently, automobile circuits having increasingly higher operating voltages, e.g., 60 volts to over 700 volts, are being contemplated and implemented. Higher ratings require more robust conductive elements and more insulation. The trend towards lower cost therefore competes against the trend towards higher capacity.

Known blade fuses employ: (i) an insulating housing; (ii) conductive male terminals that fit into female terminals extending from the automobile's fuse block; and (iii) a fuse element connecting the male terminals. The male terminals have typically extended below the insulating housing. When installed in the fuse block, the housing of the fuse sits above the female terminals. The housing in such configuration and placement provides a convenient apparatus or place of the fuse to be grasped and pulled or pushed to remove or replace the fuse, respectively.

One concern facing all blade-type fuses arises when the fuse element opens. The opening of the fuse element coincides with a release of energy, particularly heat energy. Fuses are thermally activated devices, which rely on heat generated at the element to open the circuit. Particularly at low-overloads (e.g., 110% to 200% of the rated current of the fuse), a significant amount of heat is created, which can interfere with the immediate surroundings of the fuse. It is therefore desirable to mitigate or eliminate potentially harmful energy dissipation effects caused when blade fuses open.

Another issue regarding blade fuses is that they are not resettable. A blade fuse must be replaced after it has opened. Most blade fuses has diagnostic or integrity contacts so that each fuse can be tested without having to pull the fuse from the fuse block. Nevertheless, integrity testing various blade fuses to determine which one has opened can be time consuming. When it is found the fuse has no ability to show why or when it opened. Moreover, until it is replaced the load that is being protected may be partially or totally impaired. It is therefore also desirable to provide a resettable over-current protection device for automobiles.

Fuses, such as blade fuses, are selected for both their current rating as and their $I^2t$ value (or let-through energy). In many applications surges occur during the normal operation of equipment, and the fuse must allow for such operation. For overloads lasting longer than a few minutes, the fuse in many cases is selected primarily on the basis of its continuous current rating, wherein such current rating is greater than the extended overload current.

For infrequent normal overloads, fuse selection can be made on the basis of an overload curve ($I^2t$ curve), wherein the fuse is selected based on, e.g., 75% of its published time–current curve. For repetitive overloads, such as a motor drive or soft starter, fuse selection can be made on the basis of the overload curve ($I^2t$ curve), wherein the fuse is selected based on, e.g., 60% of its published time–current curve. Indeed, fuses typically have two $I^2t$ ratings; a clearing rating and a melting rating. The clearing $I^2T$ rating is the total $I^2t$ passed by the fuse as the fuse clears a fault. The Melting $I^2T$ rating is the minimum $I^2t$ required to melt the fuse element. It is therefore further desirable to provide an improved over-current protection device for automobiles, which has known and controllable $I^2t$ ratings.

SUMMARY

Described herein are examples of devices employing one or more solid-state switching devices that operate with a controller, such as a software based controller, application specific integrated circuit ("ASIC") or some combination thereof. The switching device in one embodiment is metal oxide semiconductor field effect transistor ("MOSFET"), which receives controlled voltage outputs from the controller at the gate of the MOSFET to either enable or not enable current to flow from a power source, e.g., a vehicle battery, to the drain of the MOSFET, and from the source of the MOSFET to a load, e.g., a load within the vehicle. The MOSFET can be an n-type MOSFET, for which the voltage applied at the gate is positive or a p-type MOSFET, for which the voltage applied at the gate is negative.

The controller applies and removes voltage from the gate differently based on the purpose of the application. One primary use for the apparatus of the present invention is circuit protection, such as over-current or overvoltage protection. Here, a current sensor is placed in series with the MOSFET. The sensed current is digitized so that for a particular point in time, a discrete and instantaneous current $I_t$ is known. That discrete and known current $I_t$ can be used in at least three ways to determine if a failure or fault has occurred. In one way, the discrete current $I_t$ is compared to a peak current $I_{max}$. If $I_t$ is greater than $I_{max}$ than the controller removes the positive voltage from the gate of the MOSFET, stopping flow of current to the load.

In another way, It is used in combination with a previously known current $I_{t-1}$ to calculate an instantaneous rate of change $dI/dt$, which equals $(I_t - I_{t-1})/t$. If that value is greater than a set maximum rate of change $dI/dt_{max}$ than the controller removes the positive voltage from the gate of the MOSFET, stopping flow of current to the load. In a further way, It is used in an energy equation to determine an instantaneous let-through energy, which is integrated with all past instantaneous let-through energies to determine a current total energy $E_{total}$ that has passed through the circuit protecting MOSFET. If $E_{total}$ becomes greater than a set total energy $E_I{}^2{}_t$, the controller removes the voltage from the gate of the MOSFET, stopping the flow of current to the load.

The apparatus also provides overtemperature protection. A temperature at the MOSFET or junction temperature is sensed. The sensed temperature is digitized so that for a particular point in time, a discrete and instantaneous temperature $T_t$ is known. That discrete and known temperature $T_t$ is compared with a set maximum temperature $T_{max}$. If $T_t$ rises above $T_{max}$ than the controller removes the voltage from the gate of the MOSFET, stopping flow of current to the load. Likewise, the apparatus can monitor the instantaneous rate of change of temperature and compare that against a maximum rate of change of temperature. If the maximum rate of change of temperature is exceeded, the controller removes the voltage from the gate of the MOSFET, stopping flow of current to the load.

The device can additionally or alternatively provide overvoltage protection. A voltage across the MOSFET or applied to the load is sensed. The sensed voltage is digitized so that for a particular point in time, a discrete and instantaneous voltage $V_t$ is known. That discrete and known voltage $V_t$ is compared with a set maximum voltage $V_{max}$. If $V_t$ rises above $V_{max}$ than the controller removes the positive voltage from the gate of the MOSFET, stopping flow of current to the load. Voltage failures for rate of change of voltage dV/dt and integrated energy using $V_t$, similar to DI/dt and $E_{total}$ described above, can also be monitored and lead to a removal of voltage at the gate of the MOSFET.

A logic flow diagram setting forth one example of how at least some of the above-described parameters are monitored, calculated an implemented is shown herein. Also, plots of current and energy for various over-current failure modes are shown. In particular, a low overload failure mode, a short circuit failure mode and a transient cycling failure mode are contrasted. In each case, when the instantaneous current for a particular time segment is below a nominal or expected current, the corresponding instantaneous energy $E_t$ is subtracted from $E_{total}$. When the instantaneous current for a particular time segment is above a nominal or expected current, the corresponding instantaneous energy $E_t$ is added to $E_{total}$. When $E_{total}$ or cumulative $E_I^2 t$ energy for the load under any three of the over-current failure modes reaches the set or rated total let-through energy $E_I^2 t$, the voltage at the gate of the MOSFET is removed, stopping the flow of current to the load and protecting the load from damage due to the particular mode of failure.

Because the rated total let-through energy $E_I^2 t$ (peak or di/dt rating) is specific to the load and dependent on the expected or nominal current use of the load, the resulting over-current protection device is tailored perfectly for the load. That is, standard replacement fuses are provided with a particular rating, e.g, 1 amp, 2 amp, 10 amp, etc. The fuse providing the best fit for the load is selected, even if it is not a perfect fit for the fuse. Here, the "rating" of the solid-state protection device is instead fitted to the load requirements. In the case of an automotive harness application, the "rating" of the present solid-state protection device can be tuned to the exact characteristics of the wire that needs to be protected.

Similarly, certain replacement fuses are selected to have a desired opening characteristic, e.g., a slow opening fuse, a fast response fuse, etc. For example, a motor produces an initial surge of energy when it is started. A fuse protecting the motor needs to accommodate such surge. Semiconductor devices on the other hand require response times that typically cannot be met by standard replacement blade-type fuses. The over-current protection devices described herein, being semiconductor based, have a response time sufficient to protect virtually any load that may appear in vehicle or other application using the devices.

Besides circuit protection, such an over-current and over-voltage protection, the device can alternatively or additionally be configured to controllably vary the amount of current supplied to a variable current load, such as a motor or dimmer lamp. Here, instead of waiting for a particular failure to occur to remove the voltage from the gate of the MOSFET, the controller purposefully and controllably pulses voltage on and off to the gate of the MOSFET at an on-verses-off ratio corresponding to a desired output of the load, e.g., motor speed or light intensity. This technique, known as pulse width modulation ("PWM") may operate with suitable feedback, e.g., a tachometer signal from the motor shaft to precisely control a variable load.

The controller of the device can have any one of multiple different contemplated hardware configurations, in which different control functions are placed on one or more semiconductor die or chip. In one implementation, a microcomputer chip operates with an integrated circuit ("IC") chip. The microcomputer chip includes a microprocessor, read only memory ("ROM") and random access memory ("RAM"). In another implementation, one or more or all of the microprocessor, ROM and RAM may be provided in separate chips, which intercommunicate electrically, e.g., via traces of a printed circuit board ("PCB"), with a separate ("IC") chip. In a further implementation, one or more or all of the microprocessor, ROM and RAM may be provided on a single chip with the IC chip. Each of these implementations is operable with at least one MOSFET, which is provided either on a separate chip or integrated with one of the other chips, such as the IC chip or chip containing the IC and microcomputer.

For purposes of the present invention, the controller can have any suitable combination of software and/or gated hardware in the form of an application specific integrated circuit ("ASIC"), wherein the logic routines, data storage and associated circuitry described herein are provided via gates of the ASIC. As described herein the ASIC offers advantages with respect to speed and robustness, while software offers flexibility. Thus certain features are better suited for an ASIC, while others may lend themselves to software implementation. It is also contemplated that the controller include an ASIC, which is provided on a same chip or PCB with the MOSFET, and other functionality located on a remote PCB, e.g., the motherboard or brainboard of the vehicle.

In light of the above summary, in one embodiment a circuit protection device is provided. The device includes a solid-state resettable switch. A first terminal is placed in electrical communication with a first portion of the switch. The first terminal is configured to be connected to a load. A second terminal is placed in electrical communication with a second portion of the switch. The second terminal is configured to be connected to a power source. The device further includes a controller, which is configured to enable the switch to be opened if an accumulated energy meets or exceeds a preset $I^2 t$ rating. The accumulated energy is based on a current sensed from an electrical point between one of: (i) the load and the switch or (ii) the voltage source and the switch. The electrical point can be located between either one of the first terminal and the switch or the second terminal and the switch.

The solid-state resettable switch can be a metal oxide semiconductor field effect transistor ("MOSFET"). Or, in an alternating current system, a silicon controlled rectifier ("SCR") could be used. Furthermore, the application may or may not be a solid-state application. For example, the device could be used to control a mechanical relay.

The device includes a housing, wherein at least one of: (i) the first and second terminals are accessible outside the housing; (ii) the housing additionally accepts at least one replaceable fuse; (iii) the housing accepts a plurality of the circuit protection devices; (iv) the housing accepts at least one overvoltage device; and (v) the housing is a housing of an automobile junction box. Stated another way, in an automotive or vehicle application, the device may be operable with the vehicle's junction box, be configured inside the vehicle's junction box or be expanded to be the vehicle's junction box.

The controller includes at least one of: (i) a microprocessor, (ii) a memory, (iii) an integrated circuit, (iv) an analog to digital converter; (v) a timer; (vi) an application specific integrated circuit; (vii) a voltage regulator; (viii) software located on a printed circuit board ("PCB") different that a PCB on which the switch is located; and (ix) a programmable logic controller ("PLC") having any one or more of a microprocessor, random access memory ("RAM") or read only memory ("ROM"). In an embodiment, these components can be integrated into one package.

The controller can operate with one or more MOSFET and enable a voltage applied to the gate of the MOSFET to become at least substantially zero if the accumulated energy meets or exceeds the preset $I^2t$ rating. Further, the controller can be configured to: (i) store a nominal current value and read a sensed current for a time segment; (ii) add to an accumulated energy for the time segment if the sensed current is greater than the nominal current; and (iii) subtract from the accumulated energy for the time segment if the sensed current is greater than the nominal current.

The nominal current is the current that is expected for a given load. The preset $I^2t$ rating is an accumulated energy rating (sometimes termed let-through energy) for the load.

In another embodiment, circuit protection device includes a resettable switch and a logic implementer operable with the resettable switch. The logic implementer is configured to open the switch when a total amount of energy passing through the switch to a load connected to the switch over a time period meets or exceeds a rated amount of energy for the time period. The logic implementer is configured additionally to maintain the switch in a closed state if the total amount of energy passing through the switch is less than the rated amount of energy for the time period. The logic implementer can be configured to determine the total amount of energy passing through via the equation $I^2t$, wherein I is an amount of current passing through the switch and t is the time period.

The logic implementer can be configured additionally to open the switch upon at least one of the following occurrences: (i) an amount of current passing through the switch meeting or exceeding a peak current rating; (ii) a rate of change of current passing through the switch meeting or exceeding a maximum rate of change rating; and (iii) a temperature measured at the device meeting or exceeding a maximum temperature rating.

The logic implementer can include at least one of: (i) a microprocessor, (ii) a memory, (iii) an integrated circuit, (iv) an analog to digital converter; (v) a timer; (vi) an application specific integrated circuit ("ASIC"); (vii) a voltage regulator; and (viii) software located on a printed circuit board ("PCB") different than the PCB on which the switch is located.

In a further embodiment, the circuit protection device includes a resettable switch and a logic implementer operable with the resettable switch. Here, the logic implementer is configured to: (i) add an energy value due to a current level existing above a nominal current level to a total value of energy passing through the switch over a time period; (ii) subtract an energy value due to a current level existing below a nominal current level from the total value of energy passing through the switch; and (iii) open the switch when the total measured value of energy passing through the switch meets or exceeds a rated amount of energy for the device. The logic implementer can be configured to determine the total amount of energy passing through via the equation $I^2t$, wherein I is an amount of current passing through the switch and t is the time period.

It is therefore an advantage of the present invention to provide a resettable over-current apparatus.

It is another advantage of the present invention to provide an over-current apparatus with more precise circuit opening characteristics.

It is a further advantage of the present invention to simplify current routing within vehicle junction boxes.

It is yet another advantage of the present invention to reduce the need for vehicle junction box accessibility and for replacement fuses.

It is still another advantage of the present invention to provide an apparatus that provides one or more of over-current protection, switching and pulse width modulation ("PWM") for variable speed motor control and light dimming.

It is yet a further advantage of the present invention to provide an apparatus having flagging capability to a vehicle's motherboard or brainboard.

It is yet a further advantage of the present invention to provide an over-current apparatus that accepts external manual inputs.

It is still a further advantage of the present invention to provide an over-current apparatus that is less sensitive to thermal derating.

Additional features and advantages of the present invention are described in, and will be apparent from, the following Detailed Description of the Invention and the figures.

DETAILED DESCRIPTION

Figure 1:
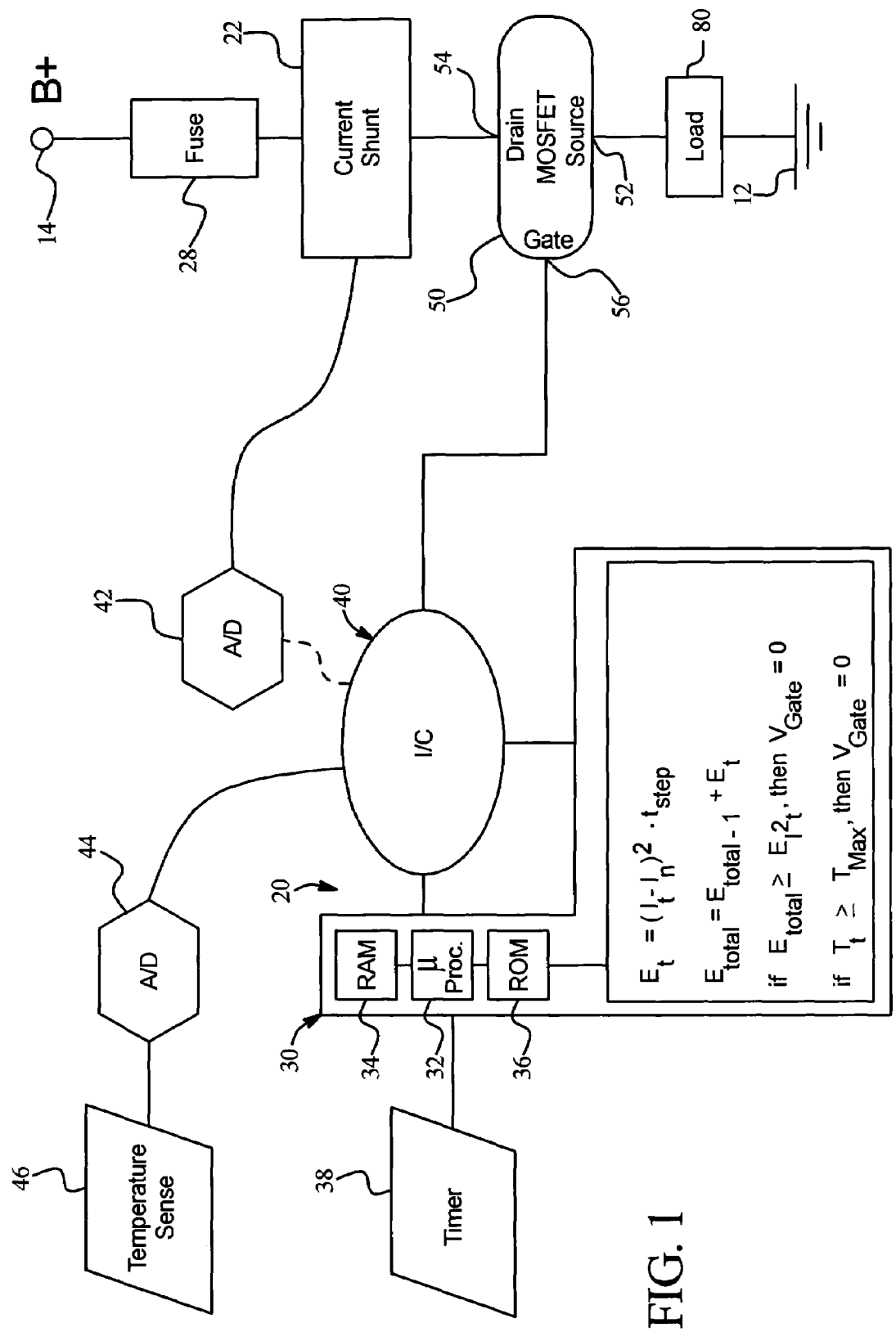
FIG. 1 is a schematic block diagram of one example of an apparatus having a controller and a solid-state resettable switch.
Figure 2:
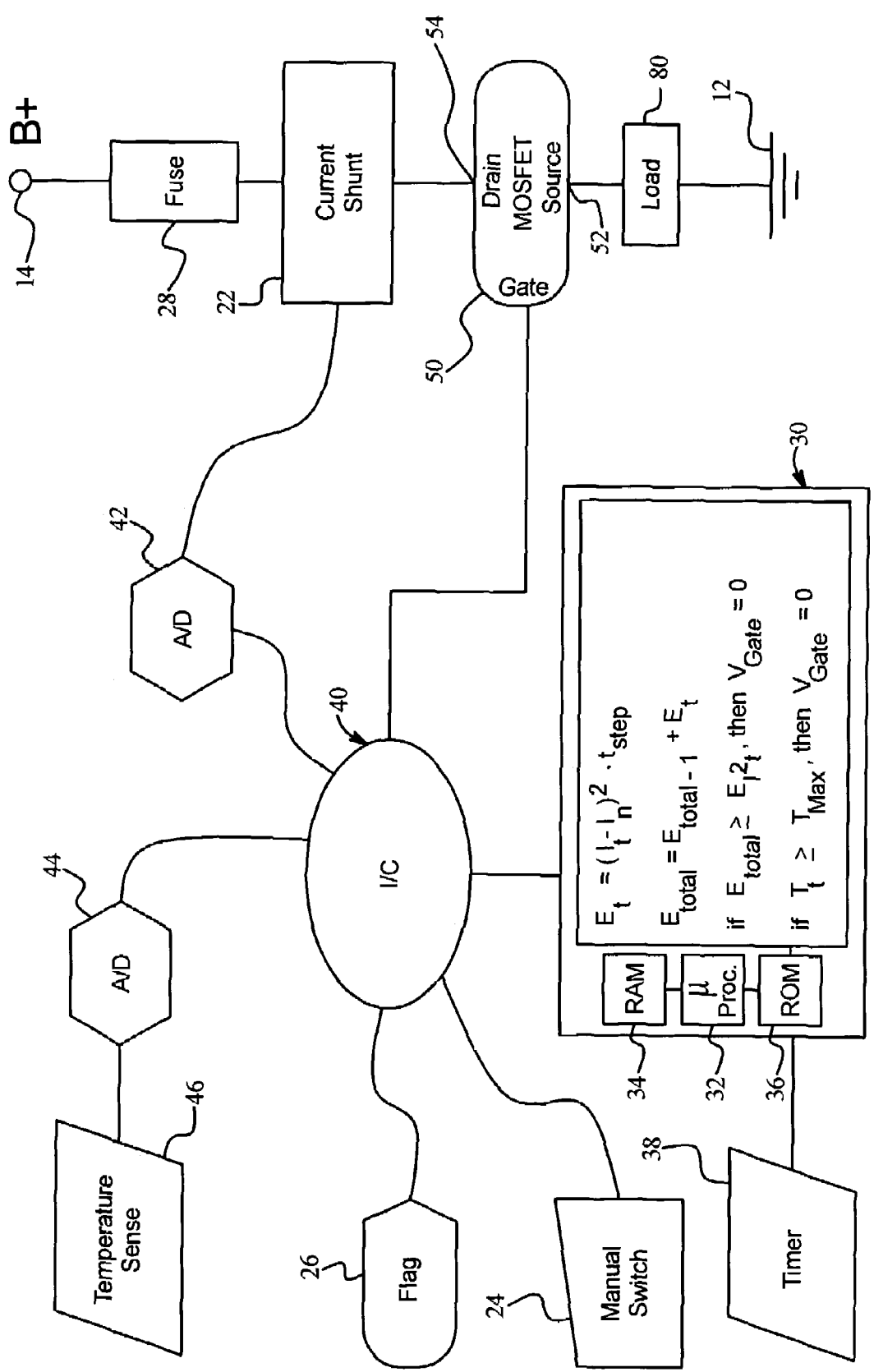
FIG. 2 is a schematic block diagram of another example of an apparatus having a controller and a solid-state resettable switch.

Referring now to the drawings and in particular to FIGS. 1 and 2, embodiments for the apparatus of the present invention are illustrated by apparatuses 10 and 100, respectively. In one implementation, apparatus 10, 100 may be installed as a component of a junction box of a vehicle, such as an automobile, truck, van, motorcycle, moped and the like. Apparatus 10, 100 at least replaces (for a given load) the need for a fuse, relay and separate diagnostic component.

In another implementation, apparatus 10, 100 may be expanded to be the junction box of such vehicle, wherein the junction box 10, 100 includes other components potentially, such as, standard junction block fuses (e.g., blade fuses or female cartridge fuses) in combination with the solid-state hardware described herein.

Apparatus 10,100 includes a controller 20. The components of controller 20 in one embodiment are located on a single printed circuit board ("PCB"). In another embodiment, components of controller 20 are integrated onto an integrated circuit ("IC") chip. In the illustrated embodiment, controller 20 includes a microcomputer 30 and an integrated circuit 40. Microcomputer 30 includes a microprocessor ("CPU") 32, random access memory ("RAM") 34 and read only memory 36 ("ROM"). Microcomputer 30 operates with a timer 38. Alternatively, timer 38 is integrated into CPU 32.

Integrated circuit ("IC") 40 operates with analog to digital converters ("A/D converters") 42 and 44. In an alternative embodiment, one or both of A/D converters 42 and 44 is integrated into IC 40. In a further alternative embodiment one or both of A/D converters 42 and 44 is integrated into CPU 32. IC 40 operates with metal oxide semiconductor field effect transistor ("MOSFET") 50.

In the illustrated embodiment, IC 40 provides a buffer between electrical devices, such as temperature sensor 46 and MOSFET 50, and logic devices, such as microcomputer 30. It should be appreciated however that any or all of the logic described herein for controller 30 may alternatively be provided via gates within an application specific integrated circuit ("ASIC"). The ASIC is a semiconductor chip that is set to carry out one or more logic routine for one or more application, which is dependent upon the load connected to MOSFET 50 and the purpose of MOSFET 50. For example, and as described below, a fusing routine using MOSFET 50 may be different for one load versus another (e.g., for a different $I^2t$ rating or a different nominal current). For a given load, the routine and MOSFET 50 may be used for one purpose or another (e.g., for a lamp, MOSFET 50 used as an over-current protection device or to act as a dimmer by varying current to the lamp).

The ASIC can be configured to consolidate the work of many chips (e.g., a single chip for each MOSFET, into a single, smaller, faster package, reducing manufacturing and support costs while increasing the speed of controller 20 and apparatus 10, 100. The ASIC in one implementation employs 0.25 micron technology, which can support more than five million gates on a single 150 MHz chip. Suitable ASIC chips are offered for example by IBM.

Hardwiring the logic routines via the ASIC reduces the number of processing cycles associated with a more software-based version of controller 20, increasing performance and reliability. The ASIC can potentially eliminate ROM 36. RAM 34 stores operational data, such as, temperature of device 10,100, current, $I^2t$, power, motor speed, etc. Alternatively, digitized information representing such data can be flagged and sent to RAM located elsewhere, e.g., at the motherboard of the vehicle. In such case RAM 34 may also be eliminated. The ASIC alternatively relies on a central microprocessor located somewhere in the vehicle's architecture. Here, the ASIC includes at least one input or output to communicate with the central microprocessor, which could be part of a junction box or motherboard of the vehicle.

It should be appreciated however that a fully hard-wired implementation of controller 20 may be too inflexible. Certain applications or loads may be subject to changing standards, e.g., safety standards, or different standards in different countries. Certain logic routines may also be the subject of ongoing research and refinement. In such cases, it may be wise to sacrifice speed and simplicity with flexibility by storing those routines in software. Generic functions, such as buffer management, queue management, address lookup and flow classification for controller 20 of device 10, 100, however, can be handled by the ASIC silicon with little risk. Controller 20 includes any suitable combination of hardwired ASIC routines and software routines.

Controller 20 of apparatus 10, 100 in any of the configurations described above performs at least the following functions: (i) provides a counting timer to sample the current from shunt 22 (located between fuse element 28 and drain 54 of MOSFET 50 as illustrated or located alternatively between MOSFET 50 and load 80) at regular intervals or segments for integration purposes described below; (ii) measures the current for a given time segment flowing to the load via A/D converter 42 (e.g., using a precision resistor and voltage measurement device), which enables a discrete current value to be plugged into a current energy algorithm as shown below;

(iii) uses the discrete current value in a derivative algorithm shown below to determine di/dt; and (iv) measures the temperature of device 10,100 for a given time segment via A/D converter 44, which enables a discrete temperature value to be plugged into at least one temperature algorithm as shown below.

Apparatus 100 has additional functionality. Here, controller 20 is configured additionally to accept a manual input from an external switch 24. Switch 24 can initially power device 100, resetting the integration routines described below. For example, switch 24 could be driven by the ignition switch of the vehicle, wherein device 100 is powered when the engine is turned on. Alternatively, switch 24 could interrupt the ongoing operation of device 100. For example, switch 24 could be closed upon an operator's selection of a vehicle light, which causes controller 20 to run an additional routine for the vehicle light. Device 100 can be configured to accept inputs from multiple switches 24 and provide a separate MOSFET 50 for each switch 24 and its associated load. Here, a separate current monitor is provided for each MOSFET, and controller 20 knows which circuit to open and when.

As illustrated, controller 20 of apparatus 100 is configured additionally to send a flag 26 upon an event, such as a fault in the load or internally within device 100. The flag 26 in an embodiment is sent to a motherboard or brainboard of the vehicle. Flag 26 may contain a packet of information, such as the time the fault occurred, the type of fault, the magnitude of the fault (e.g., peak current, total energy, di/dt) and other relevant information, such as temperature of device 10,100, current duty cycle of the load if appropriate, amount of time the load had been operating continuously, etc.

Flag 26 can trigger any suitable response, such as the shutting down of a portion or all of apparatus 100. Alternatively or additionally, flag 26 triggers an alert to the vehicle operator or a corrective action, such as the lighting of an indicator lamp on the dash board, disbursement of a liquid coolant, the starting of a cooling fan, the opening of a vent, etc.

Apparatus 10, 100 provides over-current protection or other electrical function to one or more load via one or more MOSFET 50. MOSFET 50 includes a source 52, a drain 54 and a gate 56. In the illustrated embodiment, source 52 communicates electrically with a load 80, which in turn is connected electrically to ground 12. Ground 12 can be provided on the outside of a housing of device 10, 100 as shown below in connection with FIG. 3. Ground 12 is configured to accept a wire, ribbon, connector or other suitable electrical connection device extending from load 80. As illustrated, drain 54 communicates electrically with a power source or battery contact 14, which can also be provided on the outside of a housing of device 10, 100 as shown below in connection with FIG. 3. Power source contact 14 is likewise configured to accept a wire, cable, connector or other suitable electrical connection device extending from the voltage source, the battery of a vehicle.

In an embodiment, a fuse element 28 is placed in series with the battery contact 14 and MOSFET 50 to protect the system in case of catastrophic failure of the MOSFET. Fuse element 28 is placed separately inside device 10, 100 in one embodiment. Or, element 28 is made as part of the leadframe for the silicon die.

In apparatus 10, 100, the ASIC or IC 40 of controller 20 communicates electrically with gate 56 of MOSFET 50. With an n-type transistor, as is known in the art, both source 52 and drain 54 are negatively-charged and reside on a positively-charged well of p-silicon. When controller 20 applies a positive voltage to gate 56, electrons in the p-silicon are attracted to the area under gate 56 forming an electron channel between source 52 and drain 54. When the voltage source or battery applies a positive voltage to drain 54, electrons are pulled from source 52 to drain 54. In this state, transistor 50 is on. When controller 20 removes the voltage at gate 56, electrons are not attracted to the area between source 52 and drain 54, breaking the current pathway and turning off transistor 50.

MOSFET 50 is alternatively a p-type, for which the voltage applied at gate 56 is negative. For ease of illustration, the examples described herein are used with an n-type MOSFET.

The electrical systems of many vehicles are powered by 12 VDC batteries. A voltage regulator may be provided, e.g., within IC 40, to supply a reduced (e.g., 4 to 10 VDC) steady voltage to gate 56 of MOSFET 50. MOSFET 50 in one embodiment is an IR IPS0551T MOSFET, supplied in a Super TO220 package, having an 8 amp continuous drain current, 6.0 mOhm Rds(on), 2 Watt maximum power dissipation. MOSFET 50 in an embodiment is fully protected and configured to open or turn off when its temperature exceeds 165° C. or when drain current reaches 100 amps.

Figure 3:
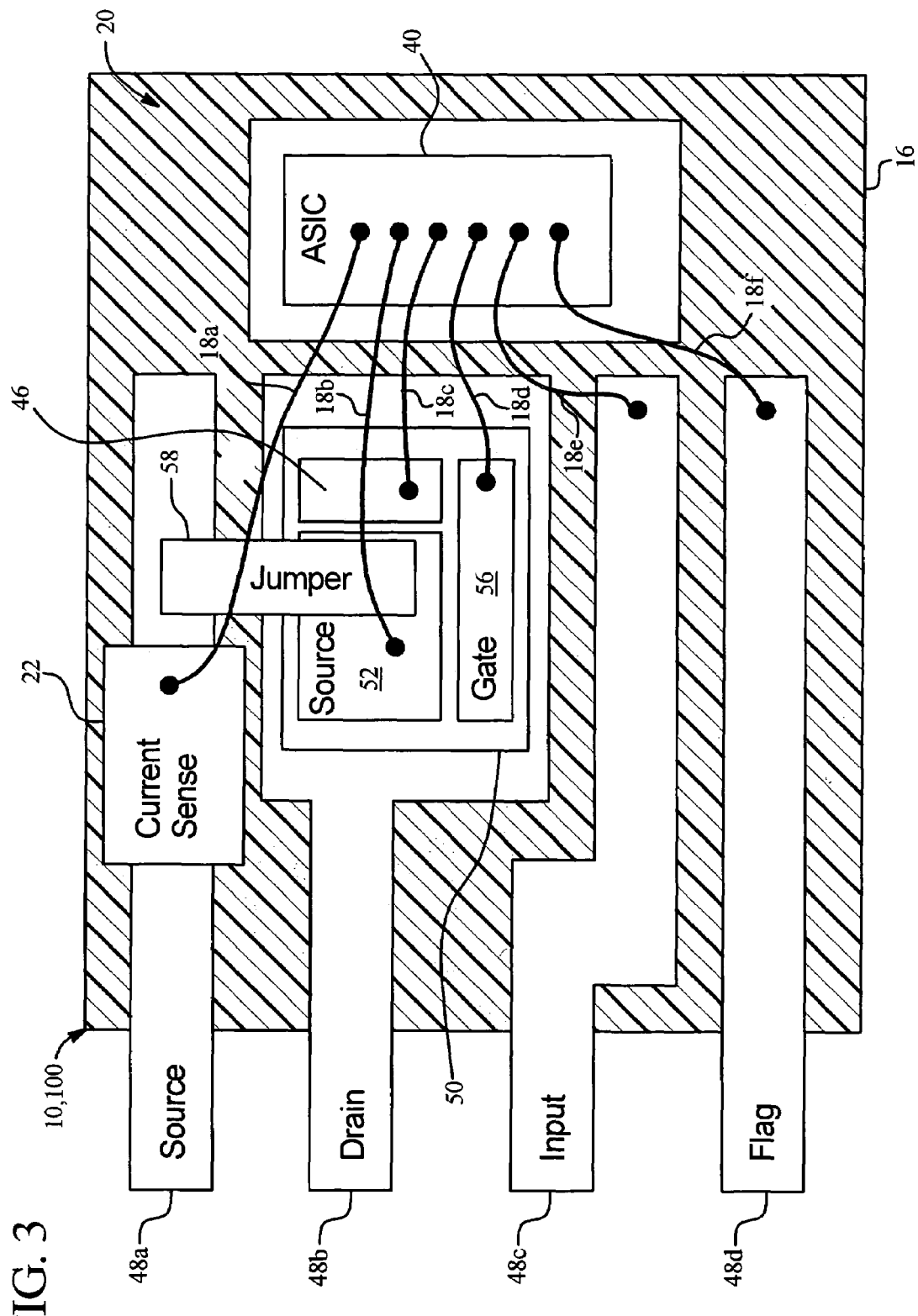
FIG. 3 is a perspective view of one embodiment of a device employing a controller and a solid-state resettable switch.

Referring now to FIG. 3, in one embodiment device 10, 100 is provided as a discrete package, which can be soldered or clipped to a printed circuit board or otherwise be connected to a junction box of a vehicle, for example. Here, device 10, 100 includes a housing 16, which in one embodiment is a plastic or otherwise electrically insulating enclosure, which can be molded over a lead frame carrying the various components. As shown, ASIC 40 of controller 20 communicates electrically with: (i) gate 56 of MOSFET 50 via bond wire 18d and (ii) source 52 of MOSFET 50 via bond wire 18c. Drain 54 (not seen) of MOSFET 50 is located beneath source 52 and gate 56. Drain 54 is located on the bottom side of the die. Drain 54 communicates electrically with drain terminal 48b. In an embodiment housing 16 is molded such that an end drain terminal 48b extends through housing 16 and resides at least substantially flush with the housing.

ASIC 40 of controller 20 communicates electrically with: (i) input terminal 48c via bond wire 18e and (ii) flag terminal 48d via bond wire 18f. Housing 16 can be molded such that respective ends of input terminal 48c and flag terminal 48d extend through housing 16 and reside at least substantially flush with the housing. Input terminal 48c enables ASIC 40 to communicate electrically with an input from manual switch 24 discussed above in connection with device 100 of FIG. 2. Flag terminal 48d enables ASIC 40 to send a flag 26 electronically to another controller or PCB within the vehicle.

In the illustrated embodiment, temperature sensor 46 is integrated into or mounted onto MOSFET 50 so that an accurate temperature may be read at MOSFET 50. Temperature sensor 46 may be of any suitable type, such as a temperature sensing diode formed on the MOSFET die. Temperature sensor 46 communicates electrically with ASIC 40 via bond wire 18c.

Current sensor 22 communicates electrically with ASIC 40 via bond wire 18a. Also, a jumper 58 is provided to link source 52 of MOSFET 50 electrically with current sensor 22 and source terminal 48a. Current sensor 22 may be of any suitable type, such as a voltage sensor operating with a precision resistor, which may be provided in a single package. FIGS. 1 and 2 show shunt 22 operating with drain 54. FIG. 3 shows sensor 22 connected electrically alternatively with source terminal 48a. Alternatively, sensor 22 is connected electrically with drain terminal 48b. Source terminal 48a enables device 10, 100 to be connected electrically to a load, which in turn is connected electrically to ground 12. Likewise, drain 54 of MOSFET 50 enables device 10, 100 to be connected electrically to power source 14.

In the device 10, 100 of FIG. 3, A/D converters 42 discussed above in connection with FIGS. 1 and 2 are integrated into ASIC 40 and therefore are not separately referenced in FIG. 3. Likewise, in the device 10, 100 of FIG. 3, timer 38 is integrated into ASIC 40 and therefore not separately referenced in FIG. 3. Also, fuse element 28 may be formed via thinning a portion of the lead frame to a desired thickness and cross-sectional area to provide the desired rating. The lead of source 52 or the lead of drain 54 can be thinned to form fuse element 28. In a preferred embodiment, fuse 28 is located as close to power source 14 as possible, making the lead of drain 54 a more likely lead to be thinned according to the arrangements shown in FIGS. 1, 2 and 5. A dissimilar metal, such as tin or nickel, may placed on a portion of all of fuse element 28 to form a "hot spot" at which the fuse element is configured to open.

It is expressly contemplated to use a single die or circuit chip for both ASIC 40 and MOSFET 50. Other components of device 10, 100 that may be placed on the same die include current sensor 22, A/D converters 42 and timers 38. This configuration provides for an efficient, convenient, compact and cost effective manufacture of device 10, 100. Alternatively, any one or more of ASIC 40, MOSFET 50 and the other components listed above are placed on one or more separate die or circuit chip.

Figure 4:
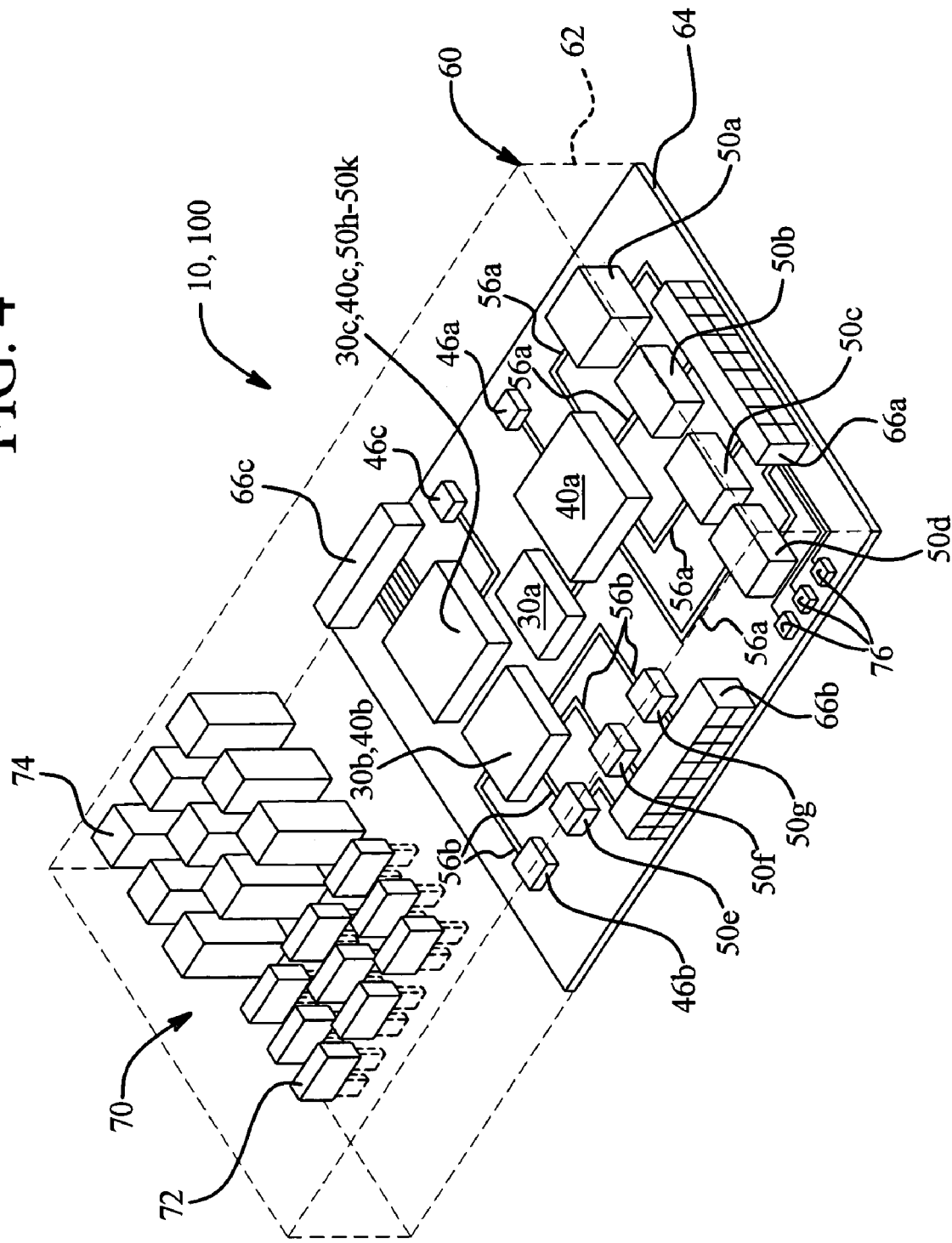
FIG. 4 is a perspective view of one embodiment of a device employing various controllers, solid-state resettable switches and standard automotive fuses.

Referring now to FIG. 4, another configuration for device 10, 100 is shown. Here, the components described above in connection with FIGS. 1 to 3 are integrated with other circuit protection and junction box related items. Also, different embodiments for controller 20 are shown.

In FIG. 4, device 10, 100 includes a housing 60. Housing 60 includes a cover 62 and a substrate 64. Substrate 64 in one embodiment is a printed circuit board ("PCB"), which is made of a material such as FR-4 material, ceramic, glass, polyimide, etc. Cover 62 in an embodiment is a molded electrically insulating material, such as plastic including polyamide, polycarbonate polyvinyl chloride, polyethylene. Cover 62 can be injection molded, blow molded or otherwise formed via any suitable process. In an alternative embodiment, at least a portion of cover 62 residing above PCB 64 is an epoxy resin or other type of electrically insulating protective coating. Cover 62 may enclose PCB 64 entirely except connectors 66a to 66c extending through openings in cover 62. Otherwise, one side PCB 64 may serve as at least a portion of one wall of housing 60.

In the illustrated embodiment, the components described above in connection with FIGS. 1 and 2 are surface mounted to PCB 64. It should be appreciated however that one or more of such components may be axially mounted, mounted via a socket or otherwise suitably fastened within device 10, 100.

PCB 64 of FIG. 4 illustrates three different hardware configurations for apparatus 10, 100 shown in the block diagrams of FIGS. 1 and 2. In FIG. 4, microcomputer 30a shown operable with IC 40a corresponds to the configuration of the block diagram of FIGS. 1 and 2. Here, microcomputer 30a employs a microprocessor 32, RAM 34 and ROM 34 as described above in connection with FIGS. 1 and 2. Microcomputer 30a is provided in a separate chip from IC 40a. IC 40a provides the functionality described above in connection with IC 40, which may integrate A/D converters 42 and 44, a voltage regulator for the MOSFET and the circuitry needed to sense temperature, current, voltage, etc., and control MOSFET 50 electrically.

As illustrated, IC 40a and microcomputer 30a control, e.g., four separate MOSFETS 50a to 50d. The electrical control of each MOSFET is the same as described above in connection with the MOSFET 50 of FIGS. 1 and 2. In particular, IC 40a is able to provide a regulated and steady voltage having at a desired direct current value at the gates 56a of each of the MOSFET 50a to 50d. When voltage is applied to those gates, current is able to flow from a voltage source (not shown) to the drain of each MOSFET 50a to 50d, and from the source of each MOSFET to its corresponding load. Thus microcomputer 30a and IC 40a are able to control each load independently. Each MOSFET may be provided for purposes of circuit protection, including overcurrent and overvoltage protection. Alternatively, one or more or all of MOSFETS 50a to 50d may provide pulse with modulation ("PWM") control of the gate voltage to a variable current load to achieve a desired output from the load. Although not illustrated, a separate current shunt 42 is provided for each MOSFET 50a to 50d.

Two or more of MOSFETS 50a to 50d may operate on the same load. For example, one of the MOSFETS can provide over-current protection for, e.g., a dimmer lamp, while a second one of the MOSFETS uses PWM to control the brightness of the lamp. The controller (microcomputer 30a and IC 40a) can control both functions simultaneously. Alternatively, the same MOSFET 50a to 50d and controller 30a and IC 40a are configured to perform dual functions for the same load. For example, the same MOSFET can be used to provide switching (on/off), PWM (dimming) and circuit protection to an interior or exterior vehicle light. Another application includes windshield wipers, which need on/off and speed (PWM) control and circuit protection (e.g., driver keeps applying power even though wipers frozen to window). A further application includes automatic windows, which need directional on/off, possible speed and circuit protection (e.g., window stuck or child playing with button keeps pressing button even after window all the way up or down).

Moving clockwise to microcomputer 30a and IC 40a, the computer and electrical circuit functions of the controller are combined on a single chip labeled 30b, 40b. Chip 30b, 40b provides all the same functions as separate chips 30a and 40a. As before, single chip 30b, 40b controls multiple MOSFETS 50e to 50g, which may each perform any of the functions described herein.

Moving further clockwise from chip 30b, 40b, device 10, 100 may alternatively or additional provide a single chip having computer functionality 30c, integrated circuit functionality 40c and MOSFET switching capability 50h to 50k. As described herein, MOSFET 50 is a semiconductor based device. It is therefore possible and contemplated to place each of the computing, circuit control and MOSFET functions on a single die of a single chip 30c, 40c, 50h to 50k.

It should be appreciated that any of the configurations (30a, 40a), (30b, 40b) or (30c, 40c, 50h to 50k) may employ any combination of software based or ASIC gate based logic as described above. Further, each of the chip configurations is operable as illustrated with a temperature sensor 46a to 46c. Temperature sensors 46a to 46c measure the temperature of the device 10, 100, which can be referred to as the junction box temperature. Temperature sensors 46a to 46c in one embodiment are thermisters and may be surface mounted as illustrated or otherwise secured within cover 62. Temperature sensing can also be done with temperature sensors that are integrated into the MOSFET. For example, temperature sensitive diodes may be embedded into the silicon of the MOSFET.

Each of the chip configurations shown in FIG. 4 output to a connector 66a to 66c. Connectors 66a to 66c enable wires or leads to and from the respective loads operable with MOSFETs 50a to 50k to be removably connected to device 10, 100. In the illustrated embodiment, connectors 66a to 66c are through-hole connected to PCB 64. Each has a surface extending through an aperture defined by enclosure 62, which enables wires or leads to be removeably connected to connectors 66a to 66c. Connectors 66a to 66c are alternatively fastened to cover 62 and hardwired or wire bounded electrically with the associated MOSFET 50.

For ease of illustration, FIG. 4 omits the showing of ground and supply traces on PCB 64. Device 10, 100 does provide such circuitry as is known generally to those of skill in the art.

Device 10, 100 may be provided as a component within a junction box of a vehicle, such as an automobile, truck, van, motorcycle, moped and the like. Such junction box may include, in addition to the circuit protection provided by MOSFETs 50a to 50k, standard fuses, such as blade fuses 72 and female cartridge fuses 74. Alternatively, as illustrated device 10, 100 may itself be the junction box for the vehicle and include a fuse portion 70, which accepts replacement fuses 72 and 74. That is, it is contemplated expressly to provide standard replacement fusing in combination with the MOSFET switching described herein. One suitable blade fuse 72 is provided by the assignee of the present invention and marketed under the trade name Mini® fuse. One suitable cartridge fuse is provided by the assignee of the present invention and marketed under the trade name Jcase® Fuse.

Also, as shown on PCB 64, the smart switching described herein is operable alternatively with other types of discrete circuit protection devices, such as overvoltage protection devices 76. One suitable overvoltage protection device is provided by the assignee of the present invention and marketed under the trade name PulseGuard®. That device employs a polymer based voltage variable material. Other types of overvoltage devices, such as ceramic-based varistors, may be provided alternatively or additionally.

Figure 5:
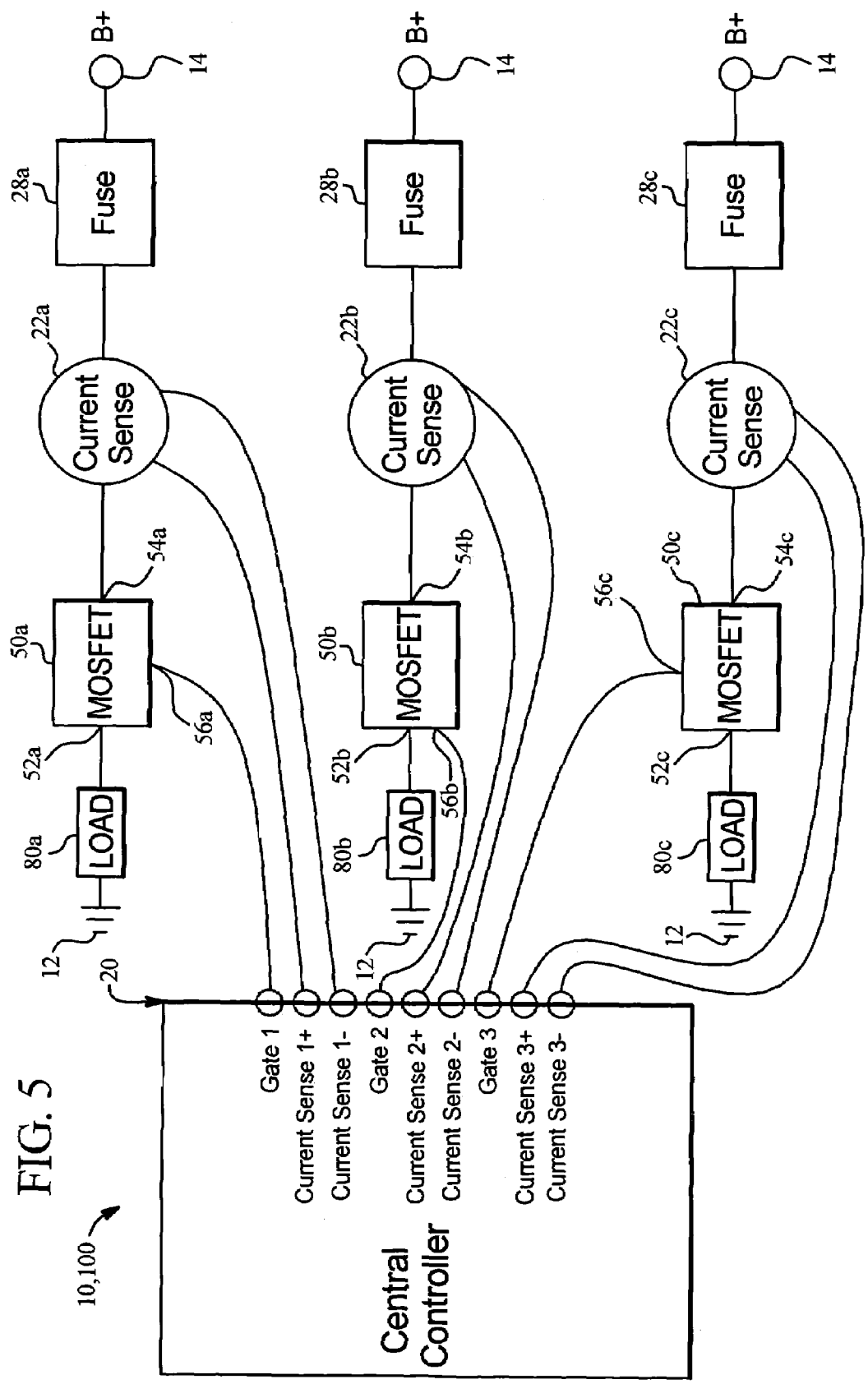
FIG. 5 is a schematic view of one embodiment of a device including a controller configured to support multiple solid-state resettable switches.

Referring now to FIG. 5, one embodiment for device 10, 100 is shown. Here, controller 20 controls or supports multiple solid-state resettable switches 50a to 50c. Device 10, 100 in an embodiment includes a housing (not shown), which can be any suitable insulating housing. Device 10, 100 of FIG. 5 can have any of the hardware configurations shown in FIG. 4, e.g., the chip for controller 20 can include any suitable combination of microcomputer 30, IC or ASIC 40, and ressetable switch or MOSFET 50.

In the illustrated embodiment, controller 20 controls or supports three ressetable switches or MOSFET's 50a to 50c. Alternatively, resettable switches 50a to 50c are silicon-controlled rectifiers, mechanical relays or any combination thereof. More or less MOSFET's may be controlled. Gate 56a of MOSFET 50a is connected to the Gate 1 node or junction of controller 20. Source 52a of MOSFET 50a is connected electrically to load 80a, which in turn is connected electrically to ground 12. Drain 54a is connected electrically to current shunt or sensor 22a. Dual leads from current sensor or shunt 22a are connected electrically to Current Sense 1+ and Current Sense 1− nodes or junctions of controller 20. Fuse 28a is connected electrically to current sensor or shunt 22a. Fuse 28a, located between current sensor 22a and battery source 14, protects the circuiting of MOSFET 50a from larger over-current conditions.

Gate 56b of MOSFET 50b is connected to the Gate 2 node or junction of controller 20. Source 52b of MOSFET 50b is connected electrically to load 80b, which in turn is connected electrically to ground 12. Drain 54b is connected electrically to current shunt or sensor 22b. Dual leads from current sensor or shunt 22b are connected electrically to Current Sense 2+ and Current Sense 2− nodes or junctions of controller 20. Fuse 28b is connected electrically to current sensor or shunt 22b. Fuse 28b, located between current sensor 22b and source 14b, protects the circuitry of MOSFET 50b from larger over-current conditions.

Gate 56c of MOSFET 50c is connected to the Gate 3 node or junction of controller 20. Source 52c of MOSFET 50c is connected electrically to lead 80c, which in turn is connected electrically to ground 12. Drain 54c is connected electrically to current shunt or sensor 22c. Dual leads from current sensor or shunt 22c are connected electrically to Current Sense 3+ and Current Sense 3− nodes or junctions of controller 20. FIG. 28c is connected electrically to current sensor or shunt 22c. Fuse 28c, located between current sensor 22c and source 14b, protects the circuitry of MOSFET 50c from larger over-current conditions.

As seen in FIG. 5, controller 20 provides the necessary connections for all of the electronic components of device 10, 100. The associated analog to digital conversions and timing functions can also be integrated into the circuit of the chip of controller 20. Associated temperature sensors 46, one for each MOSFET 50a to 50c, can also be integrated into the chip of controller 20. Further, as described above, fuse element 28 can be formed as an, e.g., thinned part of the leadframe for the silicon die.

Figure 6:
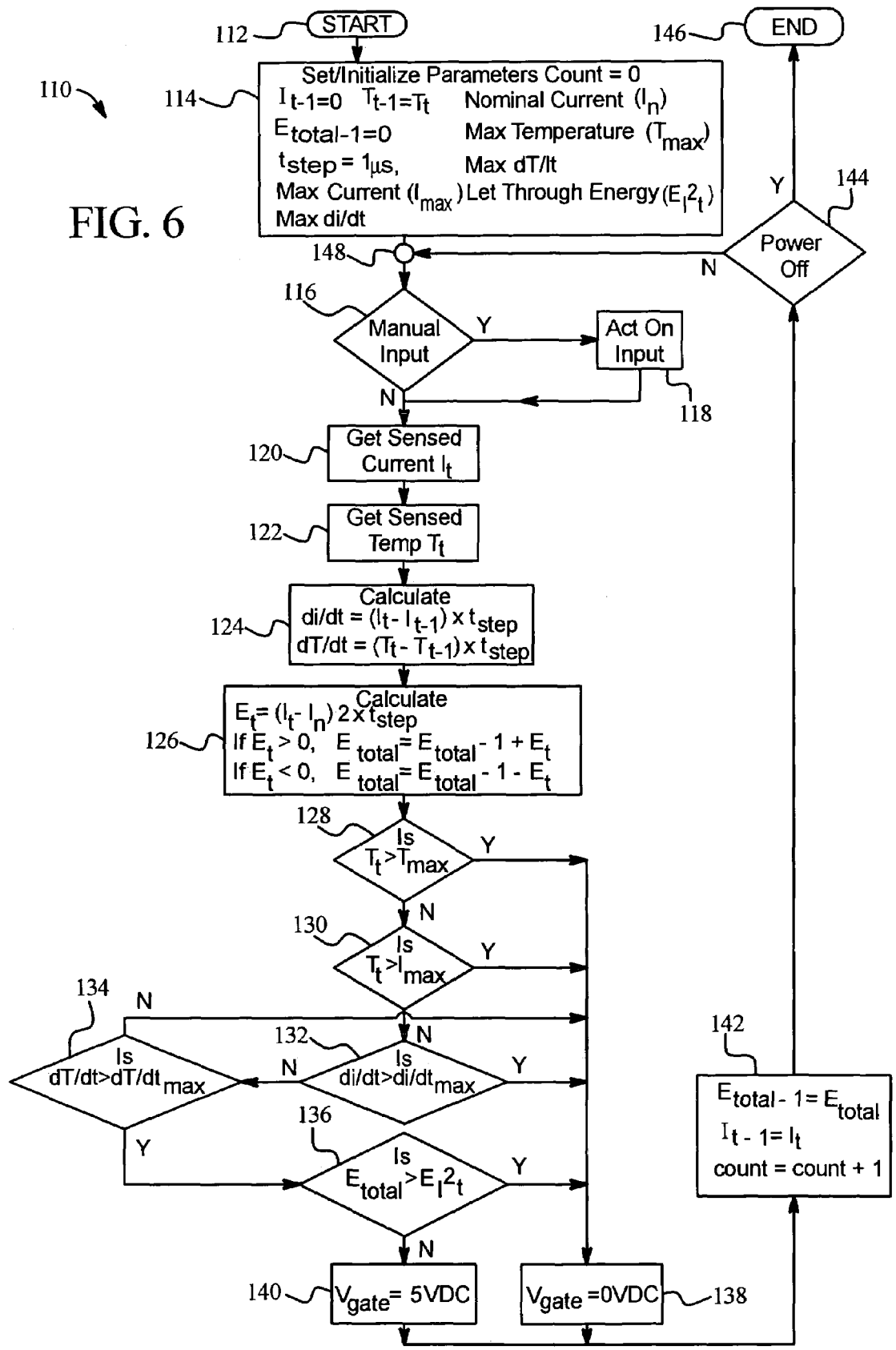
FIG. 6 is a schematic flow diagram showing one embodiment of at least some of the logic implemented by the controller operable with the resettable switch.

Referring now to FIG. 6, one embodiment of at least a portion of the logic that controller 20 uses (via software or ASIC technology) to control the solid-state resettable switch 50 is illustrated via sequence 110. The logic shown in sequence 110 is for a circuit protection application. It should be appreciated that controller 20 alternatively or additionally employs different logic for a different application for the resettable switch, such as switching or PWM as has been discussed herein.

Upon starting logic sequence 110 as indicated by oval 112, logic sequence 110 set or initializes certain parameters as indicated by block 114. Block 114 illustrates nine such parameters. As illustrated in connection with block 114, the current for a time t−1, $I_{t-1}$ is set initially to zero. A value for $I_{t-1}$ is needed to calculate an initial rate of change of current or di/dt as described below in connection with block 124. Also, a value for $T_{t-1}$ is needed to calculate an initial rate of change of temperature or dT/dt as described below in connection with block 124. $T_{t-1}$ is set to the initially sensed temperature $T_t$ (in connection with block 122). A total energy at time t−1, $E_{total-1}$ is also set to zero. A value for $E_{total-1}$ is needed to calculate an initial current total energy $E_{total}$ as illustrated in connection block 126.

A cycle time or instantaneous time period $t_{step}$ is also needed and is set in this example to one microsecond ("µs"). It may be that $t_{step}$ is simply taken to be the cycling frequency time of the microprocessor or ASIC of controller 20. The value for cycling frequency time may then be inserted in place of the variable $t_{step}$ in the relevant equation shown in connection with block 126. In the illustrated embodiment, however, the step time or cycle time may be programmed by the user.

A count is initialized to zero in connection with block 114. Timer 38 shown in FIGS. 1 and 2 in an embodiment is a counting timer. Timer 38 provides not only a time period for the recycling of the logic loop, it also counts the number of times that the loop is cycled. The total time elapsed equaling the time period multiplied by the count can then be kept. An initial count for the logic loop is set to zero.

As seen in connection with block 114, various maximum values or ratings are also known at the beginning of sequence 110. For example, max or peak current $I_{max}$, max rate of current change or dI/dt, max temperature $T_{max}$, max rate of temperature change or dT/dt and the let-through energy rating $E_I^2 t$ are also set or initialized. The ratings are specific to a particular load or operating limit.

The nominal current $I_n$ is also set in connection with block 114. The nominal current $I_n$, in one embodiment is the current value that is expected to be drawn for a given load multiplied by a factor. For example, nominal current $I_n$, can be set such that the expected current draw is typically less than 75% of the nominal current $I_n$. In an embodiment nominal current is assumed to be constant for a specific load in a specific application. Even in a case where a start-up current or a transient cycling is expected, the nominal current $I_n$ is set as a constant (see, e.g., FIG. 9 for transient cycling). A high start-up or inrush current could occur for example with head lamps. A cold lamp has a high current inrush until its filament heats up and its resistance increases. Here, nominal current $I_n$ is set at a constant value, which for example is 25% higher than the expected current drawn by the head lamp after it reaches a steady state temperature.

It should be appreciated that the parameters initialized or set in connection with block 114 may be preset or be reset upon each implementation of sequence 110.

As described above in connection with device 100 of FIG. 2, in an embodiment controller 20 accepts an input from a manual switch 24. Manual switch 24 can be for example an ignition or other start-up type of switch, which initiates the logic sequence 110. Alternatively, manual input 24 is an interrupt to the load for which logic sequence 110 is being run. Here, an initial inquiry is made to determine if a manual input has been made as indicated by diamond 116. If such input has been made, logic sequence 110 acts upon the input as indicated by block 118.

For example, an over temperature condition could be flagged internally, causing an input from manual switch 24 to be sent remotely to device 10, 100. The input could be a manual input, such as from a light switch or a window lift switch. The input could be alternatively generated autonomously by another controller, such as a thermostat to start a cooling fan.

Assuming the action taken in connection with block 118 does not switch the gate voltage to zero or if no manual or automatic input is present, as determined in connection with diamond 116, sequence 110 obtains certain parameters of in real time through one or more sensor cooperating with and A/D converter. As seen in connection with block 120, for example, sequence 110 obtains a current value $I_t$, e.g., from current shunt 22 passing through A/D converter 42 as shown in connection with FIGS. 1 and 2. Current $I_t$ represents the instantaneous current for $t_{step}$ traveling to the load, e.g., from the power source (connected to contact 14 in FIGS. 1 and 2), through MOSFET 50, to the load 80, which is connected electrically to ground 12 as shown in FIGS. 1 and 2).

Similarly, as seen in connection with block 122, sequence 110 obtains a sensed temperature $T_t$, which is sensed by sensor 46 of FIGS. 1 and 2, sent through A/D converter 44, which produces a discrete value for temperature $T_t$ for the current $t_{step}$. It should be appreciated that those of skill in the art could rearrange certain steps of sequence 110, e.g., the sensing steps of blocks 120 and 122 can be flip-flopped or performed at the same time. The calculation steps shown in connection with blocks 124 and 126 can also be flip-flopped or performed at the same time.

As indicated by block 124, sequence 110 calculates the instantaneous rate of current dI/dt by subtracting the instantaneous current for the previous time period $I_{t-1}$ from the instantaneous current $I_t$ for the current time segment $t_{step}$. $I_{-1}$ is initialized to be zero. That change in current $(I_t-I_{t-1})$ is then divided by the clock cycle or time between current readings, $t_{step}$, or in this example, 1 μs. As also seen in connection with block 124, sequence 110 calculates the instantaneous rate of temperature change dT/dt by subtracting the instantaneous temperature for the previous time period $T_{t-1}$ from the instantaneous temperature $T_t$ for the current time segment $t_{step}$. $T_{t-1}$ is initialized to be the first sensed temperature $T_t$, making the initial rate of change zero. That change in temperature $(T_t-T_{t-1})$ is then divided by the clock cycle or time between current readings, $t_{step}$, or in this example, 1 μs.

As indicated by block 126, sequence 110 performs a number of calculations to ultimately determine a total amount of energy that has passed from the voltage source, through MOSFET 50, to the load. The overall equation for total energy $E_{total}$ is $E_{total-1}+E_t$. $E_{total-1}$ is the value for $E_{total}$ determined in the previous cycle or zero as initialized. $E_t$ is determined via the equation $E_t=(I_t-I_n)^2 t_{step}$. In essence, $E_t$ is the instantaneous let-through current for the particular cycle or time period $t_{step}$.

The equation for $E_t$ determines whether the instantaneous current $I_t$ is providing additive energy or subtractive energy to the overall total energy $E_{total}$. Nominal current $I_n$ is described above. If sensed current $I_t$ is greater than nominal current $I_n$, then the associated let-through energy $I^2 t$ for $I_t-I_n$ is additive. Alternatively, if sensed current $I_t$ is less than the average or expected current $I_n$, then the corresponding $I^2 t$ energy is subtractive. $E_t$ either adds energy or subtracts energy from the overall energy $E_{total}$ calculated in connection with block 126. That is, as illustrated, if $E_t$ is grater than or equal to zero, then $E_{total}=E_{total-1}+E_t$. On the other hand, if $E_t$ is less than zero, then $E_{total}=E_{total-1}-E_t$.

Sequence 110 makes a number of determinations, which culminate in a directive from controller 20 to MOSFET 50 to either switch on gate 56 (positive voltage) or switch off gate 56 (zero voltage) of the MOSFET. As indicated by diamond 128, if sensed temperature $T_t$ is greater than $T_{max}$, then the voltage applied to gate 56 of MOSFET 50 is set to zero as indicated by block 138. If not, that is, $T_t$ is less than or equal to $T_{max}$, then sequence 110 proceeds to a determination of whether the instantaneous current is above a peak. It should also be appreciated that the temperature evaluation made in connection with diamond 130 in one embodiment is the junction temperature or the temperature associated with sensor 46 shown in FIGS. 1, 2 and 3.

As indicated by diamond 130, if instantaneous current $I_t$ is greater than the peak current $I_{max}$, then the voltage applied to gate 56 of MOSFET 50 is set to zero, as indicated by block 138. If instantaneous current $I_t$ is less than or equal to maximum current $I_{max}$, then sequence 110 proceeds to a determination of whether the rate of change of current is greater than a maximum allowable rate of change of current.

[00106] As indicated by diamond 132, if the instantaneous rate of change of current dI/dt is greater than the maximum allowable rate of change of current $dI/dt_{max}$, then the gate voltage $V_{gate}$ is set to zero as indicated by block 138. If the instantaneous rate of change of current dI/dt is less than or equal to the maximum rate of change of current $dI/dt_{max}$, then sequence 110 proceeds to a determination of whether the rate of change of temperature is greater than a maximum allowable rate of change of temperature.

As indicated by diamond 134, if the instantaneous rate of change of temperature dT/dt is greater than the maximum allowable rate of change of temperature $dT/dt_{max}$, then the gate voltage $V_{gate}$ is set to zero as indicated by block 138. If the instantaneous rate of change of temperature dT/dt is less than or equal to the maximum rate of change of temperature $dT/dt_{max}$, then sequence 110 proceeds to a determination of whether a total let-through energy $E_{total}$ is greater than a rated allowable let-through current $E_{I^2 t}$.

The let-through energy associated with $I^2 t$ is typically the measure of heat energy developed within a circuit during the clearing of a fuse. $I^2 t$ is a rating that is known to those of skill in the art for fuses, which aids in the selection of a fuse. $I^2 t$ can be expressed as a "melting $I^2 t$," an "arcing $I^2 t$," or the sum of the two, which is known as a "clearing $I^2 t$." "I" is the effective let-through current (RMS), which is squared and t represents the time of opening in seconds. In sequence 110, the time of opening is the clock cycle or $t_{step}$, which in the present example is one microsecond.

As indicated by diamond 136, if total energy $E_{total}$ is greater than the rated let-through energy $E_{I^2 t}$, then the voltage at gate 56 of MOSFET 50 is set to zero, as indicated by block 138. If $E_{total}$ is less than or equal to $E_{I^2 t}$ then the voltage at gate 56 of MOSFET 50 is set to a positive voltage or in the illustrated example 5 VDC. In the illustrated example, controller 20 clears four failure checks to maintain a positive voltage at gate 56 of MOSFET 50. Alternatively, any one or more of the four failure modes could be checked. Additional failure modes, such as instantaneous sensed voltage $V_t$ versus $V_{max}$, or an integrated energy calculation based on $V_t$ could be checked. It should be appreciated that any of the comparisons in connection with diamonds 128, 130, 132, 134 and 136 could instead look to see if the sensed parameter is greater than or equal to the rating for that parameter (as opposed just being greater than), so that the sensed parameter has to be less than the rating to clear the failure mode.

Although not illustrated, the gate voltage could be initialized to a positive value in connection with the block 114, so that a positive value is generated for instantaneous current in connection with block 122. A zero value for instantaneous current however would not trip any of the failure modes shown in connection with diamonds 130, 132 and 136, so that voltage at gate 56 is set to a positive value after the first cycle of sequence 110.

In the next step as indicated by block 142, $E_{total-1}$ for the next cycles is set to be $E_{total}$ calculated in connection with block 126 for the just finished cycle. In this way, $E_{total-1}$ is known for block 126 in the next cycle. Likewise, current $I_{t-1}$ for the next cycle is set to be the instantaneous current $I_t$ of the just finished cycle sensed in connection with block 120, so that $I_{t-1}$ is known for the next rate of change calculation made in connection with block 124. Also shown in connection with block 142, the count is updated so that a total operating time can be known by multiplying the total count by the time period $t_{step}$.

Sequence 110 illustrates one embodiment in which MOSFET 50 is automatically resettable. That is, as determined in connection with diamond 144, if power is not removed from device 10, 100, sequence 110 is allowed to continue cycling, so that it is possible for controller 20 to reset the gate voltage to a positive value upon removal or cure of the failure that caused $V_{gate}$ to be set to zero. In this way, the load is repowered automatically. For example, if temperature at the junction box exceeds a maximum temperature (which may be caused by a condition other than a failure at the load), functioning of the load could resume as soon as sensed junction temperature $T_t$ equals or falls below $T_{max}$. Similarly, if an instantaneous current $I_t$ peaks above max current $I_{max}$, controller 20 would cut power to the load until the current equals or falls below the peak current. A suitable time delay could be combined with the auto-resetting feature to ensure that the failure has been sufficiently subsided or been cured sufficiently.

For a peak current, rate of current change or $E_{total}$ failure of device 10, 100 to be autoresettable, a current still needs to be sensed at least intermittently, so that controller 20 can determine if the failure has subsided. In the case of an overtemperature, temperature sensor 46 may continue to sense temperature even after $V_{gate}$ is set to zero. It is also contemplated to make certain failure modes autoresettable, e.g., overtemperature, while other failure modes, e.g., peak current, rate of current change or $E_{total}$ failure, must be manually reset or reset by an external event, e.g., upon an input from switch 24.

If power is removed from device 10, 110, sequence 110 ends as indicated by oval 146. Otherwise, sequence 110 returns to a junction point 148, which completes and restarts the logic loop just previously described.

In an alternative embodiment, sequence 110 ends when $V_{gate}$ is set to zero and power is removed from the load. In such a case, an external event, which can be a manual or automatic input, needs to occur before sequence 110 is repeated. Here, any of the five failure modes (i) overtemperature, (ii) peak current, (iii) rate of current change, (iv) rate of temperature change or (v) $E_{total}$ can end sequence 110.

Figure 7:
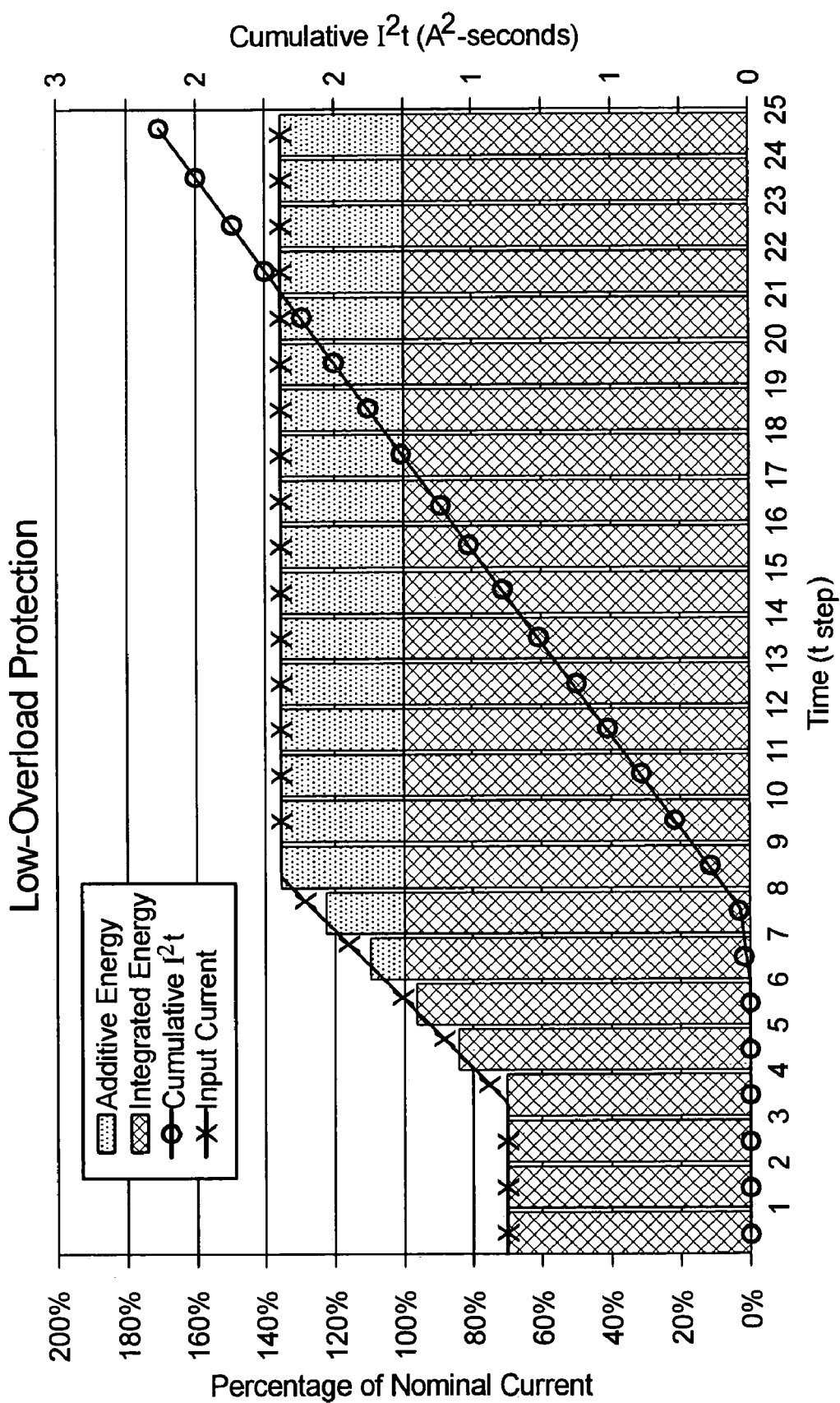
FIG. 7 is an energy curve for a low overload failure mode protected by the resettable switch.
Figure 8:
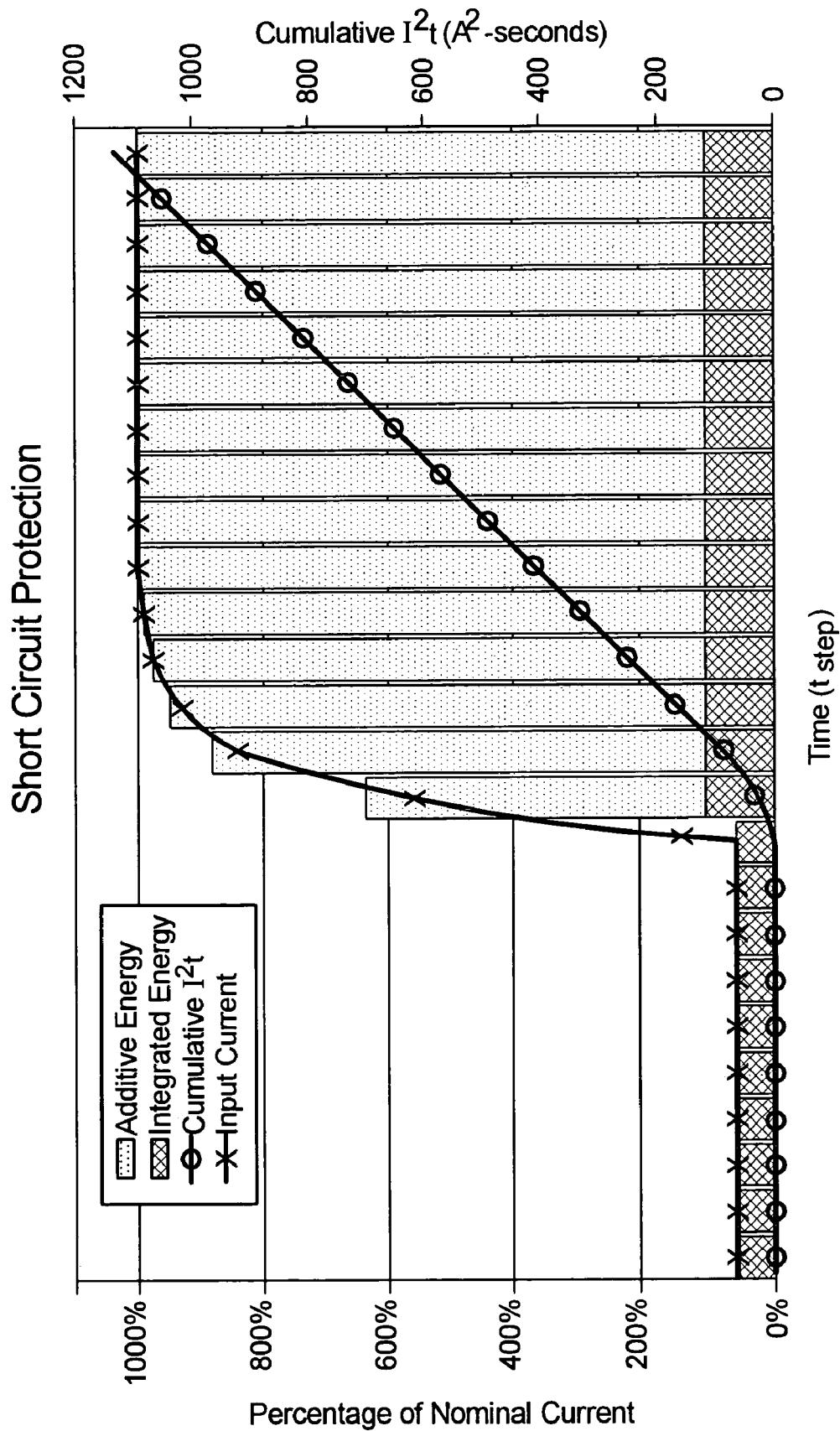
FIG. 8 is an energy curve for a short circuit failure mode protected by the resettable switch.
Figure 9:
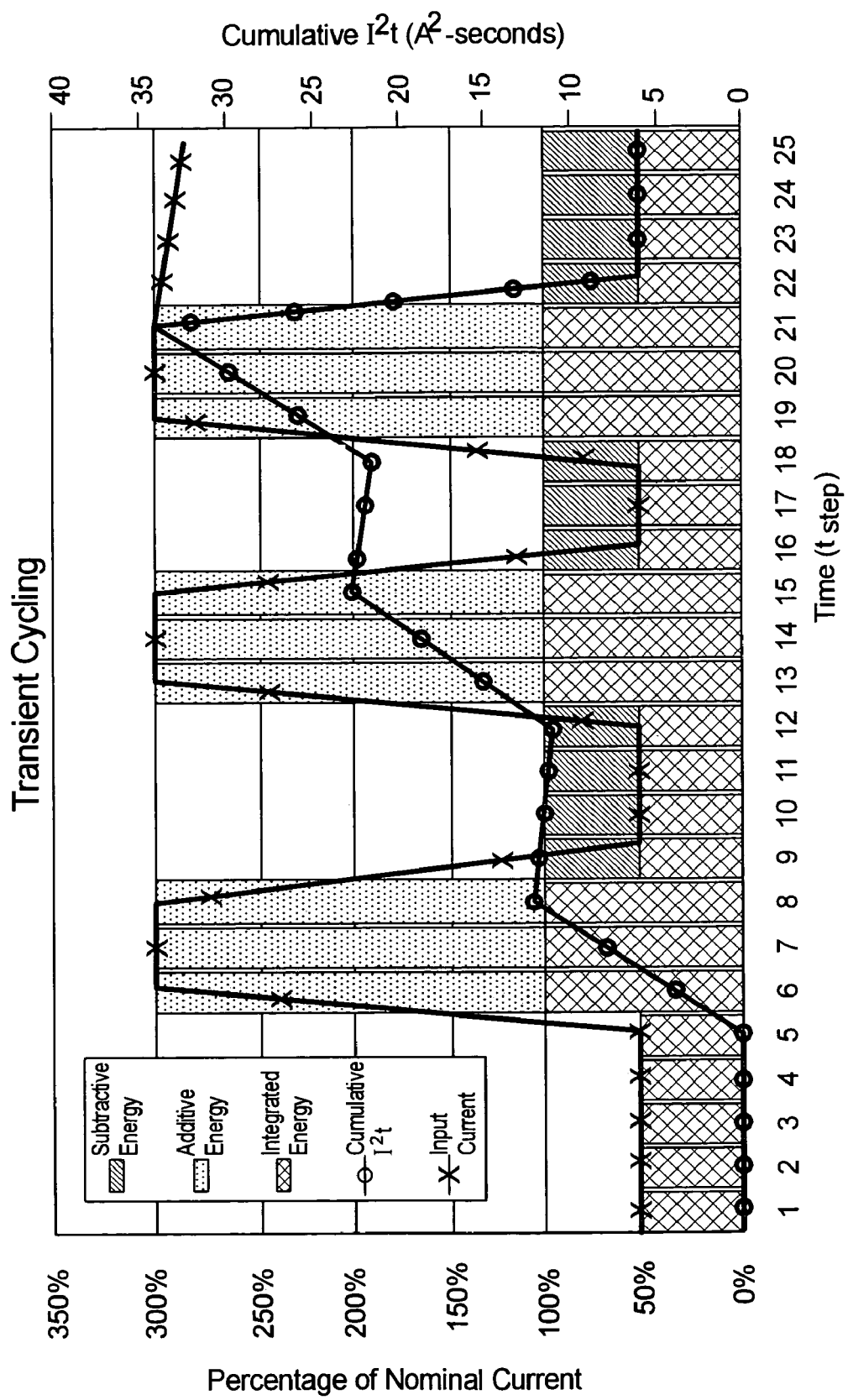
FIG. 9 is an energy curve for a transient cycling circuit failure mode protected by the resettable switch.

Referring now to FIGS. 7 to 9, plots of the actual current drawn versus (shown in bar graph form and as a smoothed curve) nominal current are shown for three failure modes, namely, low overload, short circuit and transient cycling. The plots also show added and subtracted energy associated with the instantaneous current. Also shown for each plot in FIGS. 7 to 9 is a corresponding cumulative $E_{total}$, which is the total let-through energy $E_{I^2 t}$ for any point in time.

As seen in connection with FIG. 7, the percentage of nominal current for the first six time periods is less than nominal current. Those instantaneous currents produce subtractive energy, which is shown as zero energy. Beginning with time period seven, a low overload failure occurs, e.g., due to a resistive connection to ground, and the current $I_t$ drawn becomes increasingly greater than nominal current $I_n$. At time period nine, the over-current draw becomes constant at about 135% of nominal current. The corresponding instantaneous let-through energy after time period six is additive. The total energy $E_{total}$ becomes positive after time period six and rises at a relatively constant rate. When $E_{total}$ reaches or surpasses the rated let-through energy for the load, $V_{gate}$ is set to zero and the load is protected.

In FIG. 7 because the rate of current increase is relatively gradual and the peak current drawn $I_t$ is not substantially above nominal, the failure mode that eventually causes controller 20 to remove positive voltage from gate 56 of MOSFET 50 (assuming all failure modes are monitored) is likely to be the total let-through energy $E_{total}$. Another possibility is that the junction or device 10, 100 temperature reaches or surpasses the maximum temperature $T_{max}$.

Referring now to the short circuit plot of FIG. 8, the instantaneous current $I_t$ is again less than the nominal current for the beginning time segments, here the first ten time segments, creating subtractive energy. Those instantaneous currents produce subtractive energy, which is shown as zero energy. At time segment 11, the load experiences a short, which rapidly increases the actual current drawn, approaching 1000 percent of nominal current. The corresponding instantaneous let-through energy after time period ten is additive. The total energy $E_{total}$ becomes positive after time period ten and rises at an exponential rate.

When $E_{total}$ reaches or surpasses the rated let-through energy for the load, $V_{gate}$ is set to zero and the load is protected. Here, however, the current drawn $I_t$ may surpass the rated peak current $I_{max}$ or the rate of change of current dI/dt may surpass the maximum rate of change of current $dI/dt_{max}$, causing $V_{gate}$ to become zero, before $E_{total}$ reaches the rated let-through current.

Referring now to FIG. 9 a transient failure profile is shown. As discussed above, certain applications occur in which high inrush currents are normal. Examples are inductive loads, such as motors and solenoids. Filament light bulbs also have high inrush currents. Using the filament light bulb as an example, the resistance of the filament is a function of temperature. Initially, the bulb is cool and the resistance is low. The bulb temperature immediately increases as the filament heats. The current spikes every time the bulb is lighted. The transients normally do not pose circuit protection problems, however, repeated cycling can heat the corresponding wiring and can cause damage.

As seen in FIG. 9, in time segments 1 to 5, 9 to 12, 6 to 18 and 22 to 25, the instantaneous current is less than the nominal current, resulting $I^2 t$ energy is subtractive. As seen in time segments 9 to 12, 6 to 18 and 22 to 25, $E_{total}$ actually decreases slightly. During the remaining transient time periods however the instantaneous current spikes to 300 percent of nominal current (e.g., due to a wire vibrating and causing an intermediate short circuit) resulting in a relatively gradual overall increase in $E_{total}$.

Eventually, $E_{total}$ reaches the rated let-through energy $E_{I^2 t}$ and causes the gate voltage to go to zero. Alternatively, the rate of change of current dI/dt may surpass the maximum rate of change of current $dI/dt_{max}$ causing the $V_{gate}$ to be set to zero before $E_{total}$ reaches the rated let-through energy. Maximum temperature at the junction could also be the first failure mode to turn off the MOSFET. It does not appear here that the transient spike of 300 percent of nominal is enough to trip max current $I_{max}$.

Figure 10A:
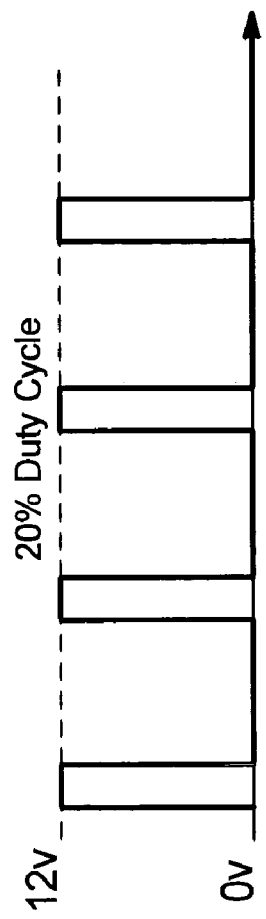
FIGS. 10A to 10C show three different duty cycles capable with the controller and a solid-state resettable switch for providing pulse width modulation ("PWM") to a variable current load.
Figure 10B:
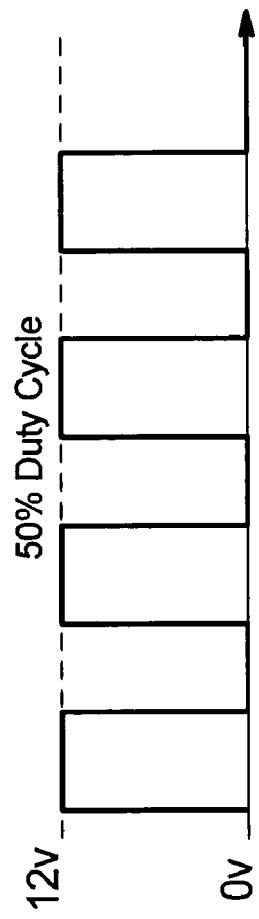
Figure 10C:
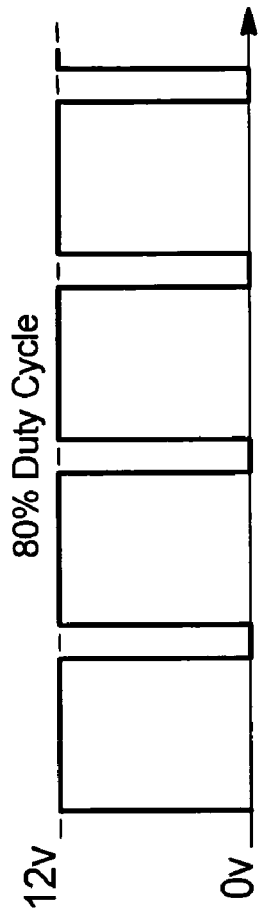

Referring now to FIGS. 10A to 10C three different pulse width modulation ("PWM") duty cycles are illustrated. The 0 to 12 volts shown along the Y-axis of the plots correspond to the voltage applied to the load via a voltage source, e.g., a vehicle battery supplying 12 VDC, when the voltage at gate 56 of MOSFET 50 is positive. When the voltage at the load is zero volts as shown for various times in FIGS. 10A to 10C, the corresponding voltage at gate 56 or MOSFET 50 is zero.

By controlling the percentage of time that $V_{gate}$ is positive, the duty cycle to the corresponding load can be varied. The MOSFET is switched rapidly on and off using this PWM technique. The MOSFET is in effect a control gate that allows a precise amount of current to flow to a variable current load, such as a motor. When controller 20 and MOSFET 50 are used to control the speed of a motor, the load connected between ground 12 and source 52 of MOSFET 50 is a motor drive. The motor drive converts the transistor-transistor-logic ("TTL") pulses or on/off voltage signals into a corresponding motor current. As the gate is switched rapidly on and off, the amount of current flowing from the drive to the motor is dependent upon the ratio between on-time and off-time. The larger the ratio, the more current will flow from the drive to the motor. The lower the ratio, the less current will flow to the motor. Through feedback systems measuring the actual speed of the motor, controller 20 and MOSFET 50 can precisely via PWM.

It is also contemplated to use MOSFET controlled PWM to control daytime running lights, theatre lights and solenoids in a vehicle for example. For example, a solenoid may be coupled with a spring-loaded valve. The width of the pulse controls the force that the solenoid exerts against the spring. The wider the pulse, the more the valve is opened.

It should be appreciated that in addition to providing accurate circuit protection, controller 20 and MOSFET 50 can alternatively be used to control varying current input devices, such as motors and dimming lights used within the vehicle. In this manner a single controller can operate with one or more MOSFET, e.g., as shown in connection with FIGS. 4 and 5, to provide the same electrical function to different loads, different electrical functions for the same load, or different electrical functions to different loads.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A circuit protection device comprising:
a solid-state resettable switch;
a first terminal in electrical communication with a first portion of the switch, the first terminal configured to be connected to a load;
a second terminal in electrical communication with a second portion of the switch, the second terminal configured to be connected to a power source; and
a controller configured to enable the switch to be opened if an accumulated energy meets or exceeds a preset $I^2t$ rating, the accumulated energy based on a current sensed from an electrical point between one of (i) the load and the switch or (ii) the power source and the switch, wherein the controller is configured to: (i) store a nominal current and read a sensed current for a time segment; (ii) add to the accumulated energy for the time segment if the sensed current is greater than the nominal current; and (iii) subtract from the accumulated energy for the time segment if the sensed current is less than the nominal current.

2. The circuit protection device of claim 1, wherein the solid-state resettable switch is of a type selected from the group consisting of: a metal oxide semiconductor field effect transistor, a silicon-controlled rectifier and a mechanical relay.

3. The circuit protection device of claim 1, which includes a housing and wherein at least one of: (i) the first and second terminals are accessible outside the housing; (ii) the housing additionally accepts at least one replaceable fuse; (iii) the housing accepts a plurality of the circuit protection devices; (iv) the housing accepts at least one overvoltage device; and (v) the housing is a housing of an automobile junction box.

4. The circuit protection device of claim 1, wherein the electrical point is located between one of: (i) the first terminal and the switch or (ii) the second terminal and the switch.

5. The circuit protection device of claim 1, wherein the controller includes at least one of: (i) a microprocessor, (ii) a memory, (iii) an integrated circuit, (iv) an analog to digital converter; (v) a timer; (vi) an application specific integrated circuit; (vii) a voltage regulator; and (viii) software located on a printed circuit board ("PCB") different that a PCB on which the switch is located.

6. The circuit protection device of claim 1, wherein the controller is configured to enable a voltage applied to the gate of a metal oxide semiconductor field effect transistor to become at least substantially zero if the accumulated energy meets or exceeds the preset $I^2t$ rating.

7. The circuit protection device of claim 1, wherein the nominal current is set for a type of failure mode selected from the group consisting of: low overload protection, short circuit protection and transient cycling.

8. The circuit protection device of claim 1, wherein the nominal current is set based on at least one power usage characteristic of the load.

9. The circuit protection device of claim 1, wherein the solid-state resettable switch and the controller are provided on a same die.

10. The circuit protection device of claim 1, wherein one of the first and second terminals is thinned to form a non-resettable fuse element.

11. The circuit protection device of claim 1, wherein the resettable switch is a first switch and which includes at least one additional resettable switch configured to modulate current flow to a variable current load.

12. A circuit protection device comprising:
a resettable switch;
a logic implementer operable with the resettable switch, the logic implementer configured to open the switch when a total amount of energy passing through the switch to a load connected to the switch over a time period meets or exceeds a rated amount of energy for the time period, wherein the controller is configured to: (i) store a nominal current and read a sensed current for a time segment; (ii) add to the accumulated energy for the time segment if the sensed current is greater than the nominal current; and (iii) subtract from the accumulated energy for the time segment if the sensed current is less than the nominal current; and
a terminal in electrical communication with at least one of the resettable switch and the logic implementer, the terminal thinned to form a non-resettable circuit protection device.

13. The circuit protection device of claim 12, wherein the logic implementer is configured additionally to open the switch upon at least one of the following occurrences: (i) an amount of current passing through the switch meeting or exceeding a peak current rating; (ii) a rate of change of current passing through the switch meeting or exceeding a maximum rate of change rating; and (iii) a temperature measured at the device meeting or exceeding a maximum temperature rating.

14. The circuit protection device of claim 12, wherein the logic implementer includes at least one of: (i) a microprocessor, (ii) a memory, (iii) an integrated circuit, (iv) an analog to digital converter; (v) a timer; (vi) an application specific integrated circuit; (vii) a voltage regulator; and (viii) software located on a printed circuit board ("PCB") different that a PCB on which the switch is located.

15. The circuit protection device of claim 12, wherein the resettable switch is of a type selected from the group consisting of: a metal oxide semiconductor field effect transistor, a silicon-controlled rectifier and a mechanical relay.

16. A circuit protection device comprising:
a resettable switch; and
a logic implementer operable with the resettable switch, the logic implementer configured to: (i) add energy due to a current level existing above a nominal current level to a total amount of energy passing through the switch over a time period; (ii) subtract energy due to a current level existing below a nominal current level from the total amount of energy passing through the switch; and (iii) open the switch when the total amount of energy passing through the switch meets or exceeds a rated amount of energy for the time period.

17. The circuit protection device of claim 16, wherein the total amount of energy passing through the switch is equal to $I^2 t$, wherein I is an amount of current passing through the switch and t is the time period.

18. The circuit protection device of claim 16, wherein the logic implementer is configured additionally to open the switch upon at least one of the following occurrences: (i) an amount of current passing through the switch meeting or exceeding a peak current rating; (ii) a rate of change of current passing through the switch meeting or exceeding a maximum rate of change rating; and (iii) a temperature measured at the device meeting or exceeding a maximum temperature rating.

19. The circuit protection device of claim 16, wherein the logic implementer includes at least one of: (i) a microprocessor, (ii) a memory, (iii) an integrated circuit, (iv) an analog to digital converter; (v) a timer; (vi) an application specific integrated circuit; (vii) a voltage regulator; and (viii) software located on a printed circuit board ("PCB") different that a PCB on which the switch is located.

20. The circuit protection device of claim 16, wherein the resettable switch is of a type selected from the group consisting of: a metal oxide semiconductor field effect transistor and a silicon-controlled rectifier.

21. The circuit protection device of claim 16, which includes a terminal in electrical comnmnication with at least one of the resettable switch and logic implementer, the terminal thinned to form a non-resettable fuse element.

22. A circuit protection device comprising:
a plurality of resettable switches;
a logic implementer operable with the resettable switches, the logic implementer configured to open each of the switches when a total amount of energy passing through the respective switch over a time period meets or exceeds a rated amount of energy for the time period, wherein the controller is configured to: (i) store a nominal current and read a sensed current for a time segment; (ii) add to the accumulated energy for the time segment if the sensed current is greater than the nominal current; and (iii) subtract from the accumulated energy for the time segment if the sensed current is less than the nominal current.

23. The circuit protection device of claim 22, wherein the logic implementer is configured additionally to maintain each switch in a closed state if the total amount of energy passing through the switch is less than the rated amount of energy for the time period.

24. The circuit protection device of claim 22, wherein the logic implementer is configured additionally to open each switch upon at least one of the following occurrences: (i) an amount of current passing through the switch meeting or exceeding a peak current rating; (ii) a rate of change of current passing through the switch meeting or exceeding a maximum rate of change rating; and (iii) a temperature measured at the device meeting or exceeding a maximum temperature rating.

25. The circuit protection device of claim 22, wherein the logic implementer includes at least one of: (i) a microprocessor, (ii) a memory, (iii) an integrated circuit, (iv) an analog to digital converter; (v) a timer; (vi) an application specific integrated circuit; (vii) a voltage regulator; and (viii) software located on a printed circuit board ("PCB") different that a PCB on which the switch is located.

* * * * *